US009356217B2

(12) United States Patent
Aoai et al.

(10) Patent No.: US 9,356,217 B2
(45) Date of Patent: May 31, 2016

(54) ELECTRICALLY CONDUCTIVE COMPOSITION, AN ELECTRICALLY CONDUCTIVE FILM USING THE COMPOSITION AND A METHOD OF PRODUCING THE SAME

(71) Applicant: FUJIFILM Corporation, Minato-ku, Tokyo (JP)

(72) Inventors: Toshiaki Aoai, Ashigarakami-gun (JP); Ryo Nishio, Ashigarakami-gun (JP); Naoyuki Hayashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 314 days.

(21) Appl. No.: 14/040,086

(22) Filed: Sep. 27, 2013

(65) Prior Publication Data

US 2014/0060602 A1   Mar. 6, 2014

Related U.S. Application Data

(63) Continuation of application No. PCT/JP2012/057762, filed on Mar. 26, 2012.

(30) Foreign Application Priority Data

Mar. 28, 2011 (JP) ................................. 2011-070393
Oct. 31, 2011 (JP) ................................. 2011-238783

(51) Int. Cl.
*H01L 35/12* (2006.01)
*H01L 51/44* (2006.01)
(Continued)

(52) U.S. Cl.
CPC ................. *H01L 35/12* (2013.01); *B82Y 30/00* (2013.01); *C08K 5/0008* (2013.01); *C08K 5/03* (2013.01); *C08K 5/372* (2013.01); *C08K 7/24* (2013.01); *C09D 165/00* (2013.01); *H01B 1/24* (2013.01); *H01L 51/444* (2013.01); *C08G 61/04* (2013.01); *C08G 61/126* (2013.01); *C08G 2261/124* (2013.01); *C08G 2261/135* (2013.01); *C08G 2261/1412* (2013.01); *C08G 2261/1424* (2013.01); *C08G 2261/3223* (2013.01);
(Continued)

(58) Field of Classification Search
CPC .............................. H01L 35/12; H01L 51/444
USPC ....................... 136/205, 206, 220, 224, 236.1
See application file for complete search history.

(56) References Cited

U.S. PATENT DOCUMENTS

2007/0277866 A1* 12/2007 Sander .................... H01L 35/34
136/230

FOREIGN PATENT DOCUMENTS

CN          1836341 A    9/2006
JP          06-228824 A  8/1994
(Continued)

OTHER PUBLICATIONS

JP2005281672 (A)—Oct. 13, 2005 Saito Takashi; Manabe Toru; Shimizu Tatsuji, machine translation.*

(Continued)

*Primary Examiner* — Susan D Leong
(74) *Attorney, Agent, or Firm* — Sughrue Mion, PLLC

(57) ABSTRACT

An electrically conductive composition, containing (A) a carbon nanotube, (B) an electrically conductive polymer, and (C) an onium salt compound, an electrically conductive film using the composition, and a method of producing the electrically conductive film.

21 Claims, 1 Drawing Sheet

(51) Int. Cl.
- *B82Y 30/00* (2011.01)
- *H01B 1/24* (2006.01)
- *C09D 165/00* (2006.01)
- *C08K 5/00* (2006.01)
- *C08K 5/03* (2006.01)
- *C08K 5/372* (2006.01)
- *C08K 7/24* (2006.01)
- *C08G 61/04* (2006.01)
- *C08G 61/12* (2006.01)
- *C08K 5/43* (2006.01)
- *C08K 5/55* (2006.01)

(52) U.S. Cl.
CPC *C08G2261/3243* (2013.01); *C08G 2261/3422* (2013.01); *C08G 2261/51* (2013.01); *C08G 2261/55* (2013.01); *C08G 2261/76* (2013.01); *C08G 2261/792* (2013.01); *C08G 2261/90* (2013.01); *C08K 5/43* (2013.01); *C08K 5/55* (2013.01); *C08K 2201/011* (2013.01); *Y02E 10/549* (2013.01); *Y02P 20/129* (2015.11); *Y02P 20/13* (2015.11); *Y02P 70/521* (2015.11)

(56) References Cited

FOREIGN PATENT DOCUMENTS

| | | |
|---|---|---|
| JP | 2000-044216 A | 2/2000 |
| JP | 2003-096313 A | 4/2003 |
| JP | 2003-332639 A | 11/2003 |
| JP | 2004-195678 A | 7/2004 |
| JP | 2005-089738 A | 4/2005 |
| JP | 2005-281672 A | 10/2005 |
| JP | 2006-265534 A | 10/2006 |
| JP | 2007-056125 A | 3/2007 |
| JP | 2008-024523 A | 2/2008 |
| JP | 2009-242144 A | 10/2009 |
| JP | 2010-018696 A | 1/2010 |
| JP | 2010-270205 A | 12/2010 |
| JP | 2012-006773 A | 1/2012 |
| WO | 2011/142433 A1 | 11/2011 |

OTHER PUBLICATIONS

Communication dated Apr. 14, 2015 from the State Intellectual Property Office of the P.R.C. in counterpart application No. 201280015905.5.

Communication dated Jul. 31, 2014, issued by the European Patent Office in counterpart European application No. 12765304.6.

International Search Report of PCT/JP2012/057762 dated Jun. 26, 2012.

Ayumi Ishibashi et al., "Individual Dissolution of Single-Walled Carbon Nanotubes in Aqueous Solutions of Steroid or Sugar Compounds and Their Raman and Near-IR Spectral Properties" Chemistry A European Journal, 2006, pp. 7595-7602, vol. 12.

M. F. Islam et al., "High Weight Fraction Surfactant Solubilization of Single-Wall Carbon Nanotubes in Water", Nano Letters, 2003, pp. 269-273, vol. 3, No. 2.

Hongwei Gu et al., "Fabrication of Free-standing, Conductive, and Transparent Carbon Nanotube Films", Advanced Materials, 2008, pp. 4433-4437.

Michele T. Byrne et al., "Recent Advances in Research on Carbon Nanotube—Polymer Composites" Advanced Materials, 2010, vol. 22, pp. 1672-1688.

* cited by examiner

ELECTRICALLY CONDUCTIVE COMPOSITION, AN ELECTRICALLY CONDUCTIVE FILM USING THE COMPOSITION AND A METHOD OF PRODUCING THE SAME

FIELD OF THE INVENTION

The present invention relates to an electrically conductive composition using a carbon nanotube, an electrically conductive film using the composition and a method of producing the same.

BACKGROUND OF THE INVENTION

In recent years, progress in an electronics field has successively led to research and development of new electronics materials. Such new material includes a new nanocarbon material such as a carbon nanotube and graphene. These materials are investigated on characteristics thereof, and development and applied research have made progress as a new electrically conductive material having a high electrical conductivity in place of a conventional metallic material.

Meanwhile, an image display device typified by a liquid crystal display (LCD), a plasma display panel (PDP), or an electroluminescence (EL) device has been applied to not only a television or a computer, but also units in various fields, such as various kinds of mobile units that have been widely used in recent years, and has made remarkable progress. In recent years, an energy shift to non-fossil energy has been required in view of a global environment, and therefore widespread use of a solar cell and an improvement in the function thereof are also required.

Such display device or solar cell uses a transparent electrically conductive film. The transparent electrically conductive film generally uses a metallic material such as ITO (indium tin oxide), and is formed by forming a film of the metallic material on a glass substrate by a vapor phase process such as a vacuum deposition process and a sputtering process. However, in the vapor phase process, control of conditions in a producing step is difficult, a large amount of cost is required for a production unit or the like, and enlargement of a film-forming area is also difficult.

Further, in electrical equipment such as a cellular phone and mobile equipment, substrate materials thereof has been shifted from glass to a plastic, for meeting a strong demand for reducing the weight and improving the flexibility. If a plastic substrate is used, weight of a display unit can also be reduced to a half or less of weight in a case of a glass substrate, and strength and impact resistance can also be significantly improved. However, the plastic substrate has insufficient heat resistance for use in a conventional vapor phase process which requires high heat resistance for the substrate. Moreover, use of the plastic substrate has other problems such as a decrease in adhesion of a formed coating film to the substrate, resulting in being easily detached.

In order to solve the problem, if an electrically conductive material containing the nanocarbon material such as the carbon nanotube can be prepared on a plastic-based material, film formation by a coating method such as spin coating can be made. In this film forming, a high temperature or vacuum conditions are not essentially required, and thus a production step is simple, and production cost can be suppressed. Further, a material such as the plastic can also be utilized as the substrate, and therefore can respond to achievement of lightweight or flexible equipment, and also allows a significant improvement in strength and impact resistance. Furthermore, the electrically conductive material is also suitable for production of a large area film. In view of such advantages, development and practical use of a new electrically conductive material using the nanocarbon material are expected.

Meanwhile, upon utilization of the carbon nanotube (hereinafter, also abbreviated as CNT) to the electrically conductive material, dispersibility of the carbon nanotube into a liquid is considered to be a problem to be solved. For example, when a thin film is formed using a CNT, the CNT is dispersed into a medium such as water and an organic solvent. However, the CNT is easy to aggregate, and not easy to be dispersed thereinto. In order to solve the problem, a dispersing agent is added to a dispersion liquid for improving dispersibility of the CNT, and the dispersion liquid is coated to form a film (for example, see Non-patent literature 1 or 2). As specific methods for improving dispersibility of a CNT using a dispersing agent, a method for dispersing the CNT into an aqueous solution containing a surfactant such as sodium dodecyl sulfonate (for example, see Patent literature 1), a method using a cationic surfactant, an anionic surfactant, or a nonionic surfactant (see Patent literature 2), a method using an anionic dispersant (see Patent literature 3), and so forth are proposed.

However, these dispersion methods are limited to dispersion into an aqueous medium, and may occasionally cause a defect in the CNT during dispersion. Moreover, if an electrically non-conductive dispersing agent adheres onto a CNT surface, the electrical conductivity and semiconductor characteristics proper to the CNT are adversely affected, and thereby decreasing performance (see Non-patent literature 3).

In order to solve the problem, a method in which a conjugated polymer, so-called electrically conductive polymer, allowing transfer of electric charges between the polymer and the CNT is used to disperse the CNT into a solution of such a polymer and to improve dispersibility (for example, see Patent literatures 4 to 9 or Non-patent literature 4) is proposed. However, even by such a method, sufficient development of high electrical conductivity to the CNT is difficult.

CITATION LIST

Patent Literatures

Patent Literature 1: JP-A-6-228824 ("JP-A" means unexamined published Japanese patent application)
Patent Literature 2: JP-A-2008-24523
Patent Literature 3: JP-A-2009-242144
Patent Literature 4: JP-A-2000-44216
Patent Literature 5: JP-A-2003-96313
Patent Literature 6: JP-A-2004-195678
Patent Literature 7: JP-A-2005-89738
Patent Literature 8: JP-A-2006-265534
Patent Literature 9: JP-A-2010-18696

Non-Patent Literatures

Non-Patent Literatures 1: Chemistry A European Journal. vol.12: p.7595, 2006
Non-Patent Literatures 2: Nano Letters. vol.3: p.269, 2003
Non-Patent Literatures 3: Advanced Materials. vol.22: p.1672, 2010
Non-Patent Literatures 4: Advanced Materials. vol.20: p.4433, 2008

SUMMARY OF THE INVENTION

Problems that the Invention is to Solve

The present invention is contemplated for providing an electrically conductive composition having good dispersibility of a CNT, and high electrical conductivity, and exhibiting excellent coating property, and for providing an electrically conductive film using the composition, and for providing a method of producing the same. Moreover, the present invention is also contemplated for providing a thermoelectric conversion material formed using the composition, and having excellent thermoelectric conversion performance, and for providing a thermoelectric conversion element using the electrically conductive film and an electrically conductive laminate.

Means to Solve the Problem

In view of the above, the present inventors made extensive studies. As a result, the present inventors found that a conventional method for improving dispersibility of a CNT by using an electrically conductive polymer causes a decrease in electrical conductivity or semiconductor characteristics in a process of charge transfer in the electrically conductive polymer, and thus development of high electrical conductivity to the CNT is quite difficult. Then, the present inventors found that, when an onium salt compound is incorporated into a composition together with the CNT and the electrically conductive polymer, a new electrically conductive composition in which the high electrical conductivity inherent to the CNT was developed is obtained. Further, the present inventors found that the composition has excellent thermoelectric conversion performance, and is suitably used as a thermoelectric conversion material. The present invention has been made based on this finding.

According to the present invention, there is provided the following means:

<1> An electrically conductive composition, comprising (A) a carbon nanotube (CNT), (B) an electrically conductive polymer, and (C) an onium salt compound.
<2> The electrically conductive composition according to the item <1>, wherein (C) the onium salt compound is a compound having oxidation ability to (A) the carbon nanotube and/or (B) the electrically conductive polymer.
<3> The electrically conductive composition according to the item <1> or <2>, wherein (C) the onium salt compound is a compound that generates acid by provision of heat or irradiation with active energy rays.
<4> The electrically conductive composition according to any one of the items <1> to <3>, wherein (C) the onium salt compound is a compound represented by any one of Formulae (I) to (V).

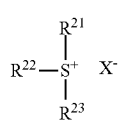

Formula (I)

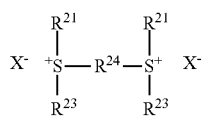

Formula (II)

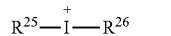

Formula (III)

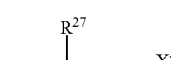

Formula (IV)

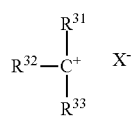

Formula (V)

wherein in Formulae (I) to (V), $R^{21}$ to $R^{23}$, $R^{25}$ to $R^{26}$, and $R^{31}$ to $R^{33}$ each independently represent a linear, branched, or cyclic alkyl group, aralkyl group, aryl group, or aromatic heterocyclic group; $R^{27}$ to $R^{30}$ each independently represent a hydrogen atom, or a linear, branched, or cyclic alkyl group, aralkyl group, aryl group, aromatic heterocyclic group, alkoxy group, or aryloxy group; $R^{24}$ represents a linear, branched, or cyclic alkylene group or arylene group; $R^{21}$ to $R^{33}$ may be further substituted;

$X^-$ represents an anion of strong acid; and any two groups of $R^{21}$ to $R^{23}$ in Formula (I), $R^{21}$ and $R^{23}$ in Formula (II), $R^{25}$ and $R^{26}$ in Formula (III), any two groups of $R^{27}$ to $R^{30}$ in Formula (IV), or any two groups of $R^{31}$ to $R^{33}$ in Formula (V) may be bonded with each other to form an aliphatic ring, an aromatic ring, or a heterocyclic ring.

<5> The electrically conductive composition according to the item <4>, wherein, in Formulae (I) to (V), $X^-$ is an anion of arylsulfonic acid, an anion of perfluoroalkyl sulfonic acid, an anion of perhalogenated Lewis acid, an anion of perfluoroalkyl sulfonimide, an anion of perhalogenated acid, or an anion of alkyl or aryl borate.
<6> The electrically conductive composition according to any one of the items <1> to <5>, wherein (A) the carbon nanotube is uniformly dispersed in the composition.
<7> The electrically conductive composition according to any one of the items <1> to <6>, further comprising a solvent.
<8> The electrically conductive composition according to any one of the items <1> to <7>, comprising (A) the carbon nanotube in an amount of 3 to 50% by mass, (B) the electrically conductive polymer in an amount of 30 to 80% by mass, and (C) the onium salt compound in an amount of 1 to 50% by mass, in the total solid content of the electrically conductive composition.
<9> The electrically conductive composition according to any one of the items <1> to <8>, which is used for thermoelectric conversion.
<10> An electrically conductive film, formed using the electrically conductive composition according to any one of the items <1> to <9>.
<11> An electrically conductive film, formed by shaping the electrically conductive composition according to the items <1> to <9>, and then providing the shaped product with heat or active energy rays.
<12> An electrically conductive laminate, comprising a substrate, and the electrically conductive film according to the item <10> or <11> on the substrate.
<13> An electrically conductive laminate, formed by coating the electrically conductive composition according to any one of the items <1> to <9> onto a substrate.

<14> An electrically conductive laminate, formed by coating the electrically conductive composition according to any one of the items <1> to <9> onto a substrate, and then providing the coated product with heat or active energy rays.
<15> The electrically conductive laminate according to any one of the items <12> to <14>, wherein the substrate is a resin film.
<16> The electrically conductive laminate according to any one of the items <12> to <15>, further having an electrode.
<17> A thermoelectric conversion element, comprising the electrically conductive film according to the item <10> or <11>, or the electrically conductive laminate according to any one of the items <12> to <16>.
<18> An electrically conductive article, using any one of the electrically conductive composition according to any one of the items <1> to <9>, the electrically conductive film according to the item <10> or <11>, and the electrically conductive laminate according to any one of the items <12> to <16>.
<19> A thermoelectric generator, using the thermoelectric conversion element according to the item <17>.
<20> A method of producing an electrically conductive film, comprising a step of shaping the electrically conductive composition according to any one of the items <1> to <9>.
<21> The method of producing an electrically conductive film according to the item <20>, wherein the shaping step is a step of coating the electrically conductive composition onto a substrate.
<22> The method of producing an electrically conductive film according to the item <20> or <21>, further comprising a step of heating the shaped product or irradiating the shaped product with active energy rays.

Effects of the Invention

An electrically conductive composition of the present invention contains a CNT uniformly dispersed thereinto to exhibit high electrical conductivity without adversely affecting excellent electrical conduction property of the CNT, and an electrically conductive composition liquid exhibits excellent coating property onto a substrate, and therefore can be suitably used for production of an electrically conductive film, an electrically conductive layer, or the like. The electrically conductive film prepared using the composition of the present invention has high electrical conductivity and good film quality, and thus can be utilized as an electrically conductive material in a wide range of applications. Specifically, the electrically conductive composition and the electrically conductive film of the present invention are useful as a transparent electrode used for various kinds of display devices typified by a liquid crystal display, or a solar cell, an electrically conductive material used for a condenser, a capacitor, or a secondary cell, an organic semiconductor material used for a photoelectric conversion device, a thermoelectric conversion device, or an organic FET, or the like.

Other and further features and advantages of the invention will appear more fully from the following description, appropriately referring to the accompanying drawings.

MODE FOR CARRYING OUT THE INVENTION

Figure 1:
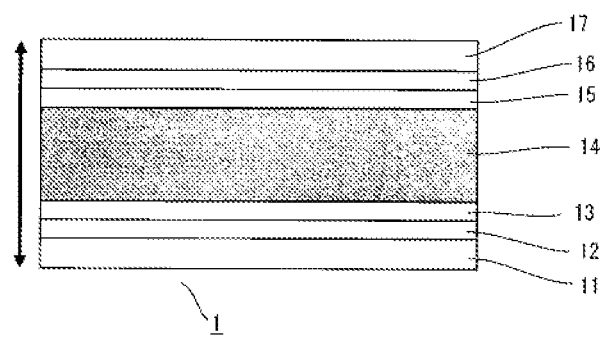
FIG. 1 is a diagram schematically showing one example of a thermoelectric conversion element of the present invention. An arrow in FIG. 1 shows a direction of temperature difference to be provided during use of the element.

An electrically conductive composition of the present invention contains (A) a CNT, and also (B) an electrically conductive polymer and (C) an onium salt compound. Use of the electrically conductive polymer allows an improvement in dispersibility of the CNT in the composition, and realization of excellent coating property without adversely affecting the electrical conductivity. Further, use of the onium salt compound allows a significant improvement in the electrical conductivity of the composition. Constitution of these compounds allows the composition to easily form a film by coating, and the formed coating film has high electrical conductivity and good film quality. Further, the composition has the high electrical conductivity, and also excellent thermoelectric conversion performance, and can be suitably used as a thermoelectric conversion material.

Following, the electrically conductive composition of the present invention will be described in detail.

(A) Carbon Nanotube (CNT)

CNTs include a single-walled CNT in which one sheet of carbon film (graphene sheet) is cylindrically wound, a double-walled CNT in which two graphene sheets are concentrically wound, and a multi-walled CNT in which a plurality of graphene sheets are concentrically wound. In the present invention, the single-walled CNT, the double-walled CNT, and the multi-walled CNT may be used alone, or in combination with two or more kinds. A single-walled CNT and a double-walled CNT have excellent properties in the electrical conductivity and the semiconductor characteristics, and therefore a single-walled CNT and a double-walled CNT are preferably used, and a single-walled CNT is more preferably used.

The single-walled CNT may be used in the form of a semiconductive one or a metallic one, or both in combination with the semiconductive one and the metallic one. When both of the semiconductive CNT and the metallic CNT are used, a content ratio of both in the composition can be adjusted as appropriate according to a use of the composition. For example, for an electrode use, from a viewpoint of the electrical conductivity, a content ratio of the metallic CNT is preferably higher. For a semiconductor use, from a viewpoint of the semiconductor characteristics, a content ratio of the semiconductive CNT is preferably higher. Moreover, the CNT may include a metal therein, or one including a molecule of fullerene or the like therein may also be used. In addition, the electrically conductive composition of the present invention may contain the CNT, and also nanocarbon materials such as a carbon nanohorn, a carbon nanocoil, and carbon nanobeads.

The CNT can be produced by an arc discharge process, a chemical vapor deposition process (hereinafter, referred to as a CVD process), a laser ablation process, or the like. The CNT used in the present invention may be obtained by any method, but preferably by the arc discharge process and the CVD process.

Upon producing the CNT, fullerene, graphite, or amorphous carbon is simultaneously formed as a by-product, and a catalyst metal such as nickel, iron, cobalt, and yttrium also remains. In order to remove these impurities, purification is preferably performed. A method of purification of the CNT is not particularly limited, but acid treatment by nitric acid, sulfuric acid, or the like, or ultrasonication is effective in removal of the impurities. In addition thereto, separation and removal using a filter is also preferably performed from a viewpoint of an improvement of purity.

After purification, the CNT obtained can also be directly used. Moreover, the CNT is generally produced in the form of strings, and therefore may be cut into a desired length according to a use. For example, for a semiconductor use, a CNT that is shorter than a distance between electrodes is preferably used in order to prevent a short circuit between the electrodes. The CNT can be cut in the form of short fibers by acid treatment by nitric acid or sulfuric acid, ultrasonication, a freeze mill process, or the like. Moreover, in addition thereto, separation using the filter is also preferred from a viewpoint of an improvement of purity.

In the present invention, not only a cut CNT, but also a CNT previously prepared in the form of short fibers can be used. Such a CNT in the form of short fibers can be obtained, for example, by forming on a substrate a catalyst metal such as iron and cobalt, and according to the CVD method, allowing on the surface thereof vapor deposition of the CNT by thermally decomposing a carbon compound at 700 to 900° C., thereby obtaining the CNT in the shape of alignment on a substrate surface in a vertical direction. The thus prepared CNT in the form of short fibers can be taken out from the substrate by a method of stripping off the CNT, or the like. Moreover, the CNT in the form of short fibers can also be obtained by supporting a catalyst metal on a porous support such as porous silicon or on an anodized film of alumina to allow on a surface thereof vapor deposition of a CNT according to the CVD process. The CNT in the form of aligned short fibers can also be prepared according to a method in which a molecule such as iron phthalocyanine containing a catalyst metal in the molecule is used as a raw material, and a CNT is prepared on a substrate by performing CVD in a gas flow of argon/hydrogen. Furthermore, the CNT in the form of aligned short fibers can also be obtained on a SiC single crystal surface according to an epitaxial growth process.

A mean length of the CNT used in the present invention is not particularly limited, but can be selected as appropriate according to a use of the composition. For example, for a semiconductor use of the electrically conductive composition of the present invention, the mean length depends on a distance between electrodes, but from viewpoints of ease of production, film-forming property, electrical conductivity, or the like, the mean length of the CNT is preferably 0.01 μm or more to 1,000 μm or less, and more preferably 0.1 μm or more to 100 μm or less.

A diameter of the CNT used in the present invention is not particularly limited, but from viewpoints of durability, transparency, film-forming property, electrical conductivity, or the like, the diameter is preferably 0.4 nm or more to 100 nm or less, more preferably 50 nm or less, and further preferably 15 nm or less.

(B) Electrically Conductive Polymer

The electrically conductive polymer used in the present invention is a polymer compound having a conjugated molecular structure. The polymer having the conjugated molecular structure means a polymer having a structure in which a single bond and a double bond are alternately connected in a carbon-to-carbon bond on a main chain of the polymer. Moreover, the electrically conductive polymer used in the present invention is not necessarily a high-molecular-weight compound, but rather may be an oligomer compound.

When the electrically conductive polymer is used together with the CNT, the CNT is uniformly dispersed in the composition without aggregation, and the coating property of the composition is improved. Moreover, a composition having high electrical conductivity is obtained. The reason is considered that the composition has a conjugated structure in which the electrically conductive polymer is elongated, and therefore charge transfer between the polymer and the CNT is smooth, and as a result, the high electrical conductivity and the high semiconductor characteristics inherent to the CNT can be effectively utilized.

Specific examples of the electrically conductive polymer used in the present invention include conjugated polymers having a repeating unit derived from a monomer selected form a thiophene-based compound, a pyrrole-based compound, an aniline-based compound, an acetylene-based compound, a p-phenylene-based compound, a p-phenylenevinylene-based compound, a p-phenyleneethynylene-based compound, a p-fluorenylenevinylene-based compound, a polyacene-based compound, a polyphenanthrene-based compound, a metal-phthalocyanine-based compound, a p-xylylene-based compound, a vinylenesulfide-based compound, a m-phenylene-based compound, a naphthalenevinylene-based compound, a p-phenyleneoxide-based compound, a phenylenesulfide-based compound, a furan-based compound, a selenophene-based compound, an azo-based compound, a metal complex-based compound, and a derivative formed by introducing a substituent into each of these compounds.

The substituent to be introduced into the above-described derivative is not particularly limited, but in consideration of compatibility with other components, a kind of medium that can be used, or the like, it is preferable to appropriate select a group that can improve dispersibility or solubility of the CNT, the electrically conductive polymer or the onium salt compound in the composition, and to introduce thereinto.

When an organic solvent is used as the medium, preferable examples of the substituent include a linear, branched, or cyclic alkyl group, alkoxy group, or thioalkyl group, and also alkoxyalkyleneoxy group, alkoxyalkyleneoxyalkyl group, crown ether group, aryl group. These groups may further have a substituent. The number of carbon atoms of the substituent is not particularly limited, but is preferably 1 to 12, and more preferably, 4 to 12. A long-chain alkyl group, alkoxy group, thioalkyl group, alkoxyalkyleneoxy group, or alkoxyalkyleneoxyalkyl group having 6 to 12 carbon atoms is particularly preferred.

When an aqueous medium is used, a hydrophilic group such as a carboxylic acid group, a sulfonate group, a hydroxyl group, and a phosphate group is preferably further introduced into each monomer terminal or the abode-described substituent.

In addition thereto, a dialkylamino group, a mono alkylamino group, an amino group, a carboxyl group, an ester group, an amide group, a carbamate group, a nitro group, a cyano group, an isocyanate group, an isocyano group, a halogen atom, a perfluoroalkyl group, a perfluoroalkoxy group, or the like can be introduced as the substituent, and such introduction is preferred.

The number of substituents that can be introduced is not particularly limited, but in consideration of the dispersibility, the compatibility, the electrical conductivity, or the like of the CNT, the electrically conductive polymer, one or a plurality of substituents can be introduced as appropriate.

Specific examples of the conjugated polymers having repeating units derived from the thiophene-based compounds and the derivatives thereof include polythiophene, a conjugated polymer including a repeating unit derived from a monomer having a substituent introduced into a thiophene ring, and a conjugated polymer including a repeating unit derived from a monomer having a condensed polycyclic structure including a thiophene ring.

Specific examples of the conjugated polymers including the repeating units derived from the monomers having the substituents introduced into the thiophene rings include poly-alkyl-substituted thiophenes such as poly-3-methylthiophene, poly-3-butylthiophene, poly-3-hexylthiophene, poly-3-cyclohexylthiophene, poly-3-(2'-ethylhexyl)thiophene, poly-3-octylthiophene, poly-3-dodecylthiophene, poly-3-(2'-methoxyethoxy)methylthiophene, and poly-3-(methoxyethoxyethoxy)methylthiophene; poly-alkoxy-substituted thiophenes such as poly-3-methoxythiophene, poly-3-ethoxythiophene, poly-3-hexyloxythiophene, poly-3-cyclohexyloxythiophene, poly-3-(2'-ethylhexyloxy)thiophene, poly-3-dodecyloxythiophene, poly-3-methoxy(diethyleneoxy)thiophene, poly-3-methoxy(triethyleneoxy)thiophene, and poly-(3,4-ethylenedioxythiophene); poly-3-alkoxy-substituted-4-alkyl-substituted thiophenes such as poly-3-methoxy-4-methylthiophene, poly-3-hexyloxy-4-methylthiophene, and poly-3-dodecyloxy-4-methylthiophene; and poly-3-thioalkylthiophenes such as poly-3-thiohexylthiophene, poly-3-thiooctylthiophene, and poly-3-thiododecylthiophene.

Among these, poly-3-alkylthiophenes or poly-3-alkoxythiophenes are preferred. With regard to polythiophene having a substituent in 3-position, anisotropy arises depending on a bonding direction in 2- or 5-position of a thiophene ring. In polymerization of 3-substituted thiophene, a mixture is produced, including one in which the thiophene rings are bonded in 2-positions with each other (HH coupling: head-to-head), one in which the thiophene rings are bonded in 2-position and 5-position (HT coupling: head-to-tail), or one in which the thiophene rings are bonded in 5-positions with each other (TT coupling: tail-to-tail). A larger ratio of the one in which the thiophene rings are bonded in 2-position and the 5-position (HT coupling) is preferred in view of further improved planarity of a polymer main chain to further easily form a π-π stacking structure between the polymers and to further facilitate transfer of electric charges. Ratios of these bonding patterns can be measured by H-NMR. In the polymer, a ratio of the HT coupling in which the thiophene rings are bonded in 2-position and 5-position is preferably 50% by mass or more, more preferably 70% by mass or more, and particularly preferably 90% by mass or more.

More specifically, as the conjugated polymer including the repeating unit derived from the monomer having the substituent introduced into the thiophene ring, and the conjugated polymer including the repeating unit derived from the monomer having the condensed polycyclic structure including the thiophene ring, the following compounds can be exemplified. In the following formulae, n represents an integer of 10 or more.

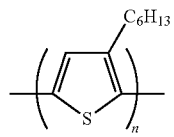

A-1

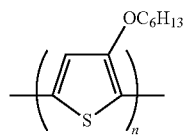

A-2

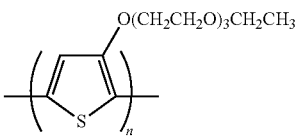

A-3

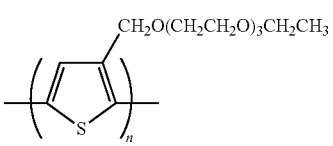

A-4

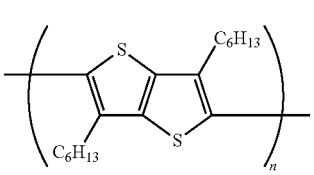

A-5

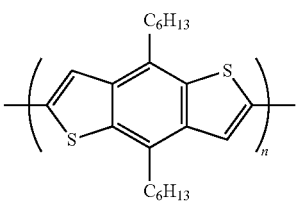

A-6

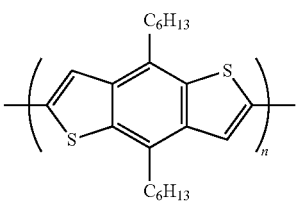

A-7

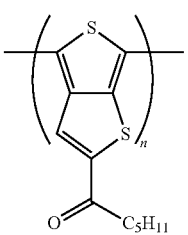

A-8

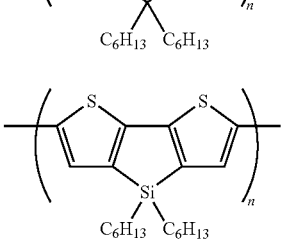

A-9

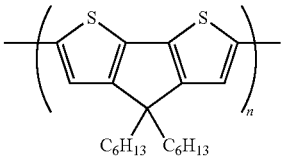

A-10

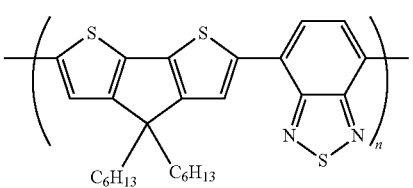

A-11

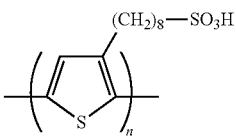

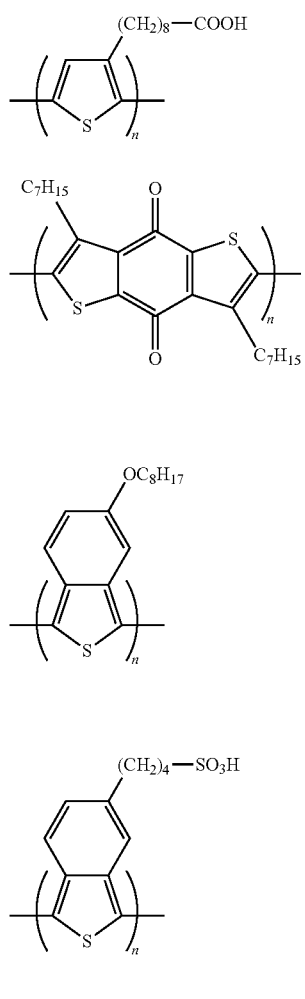

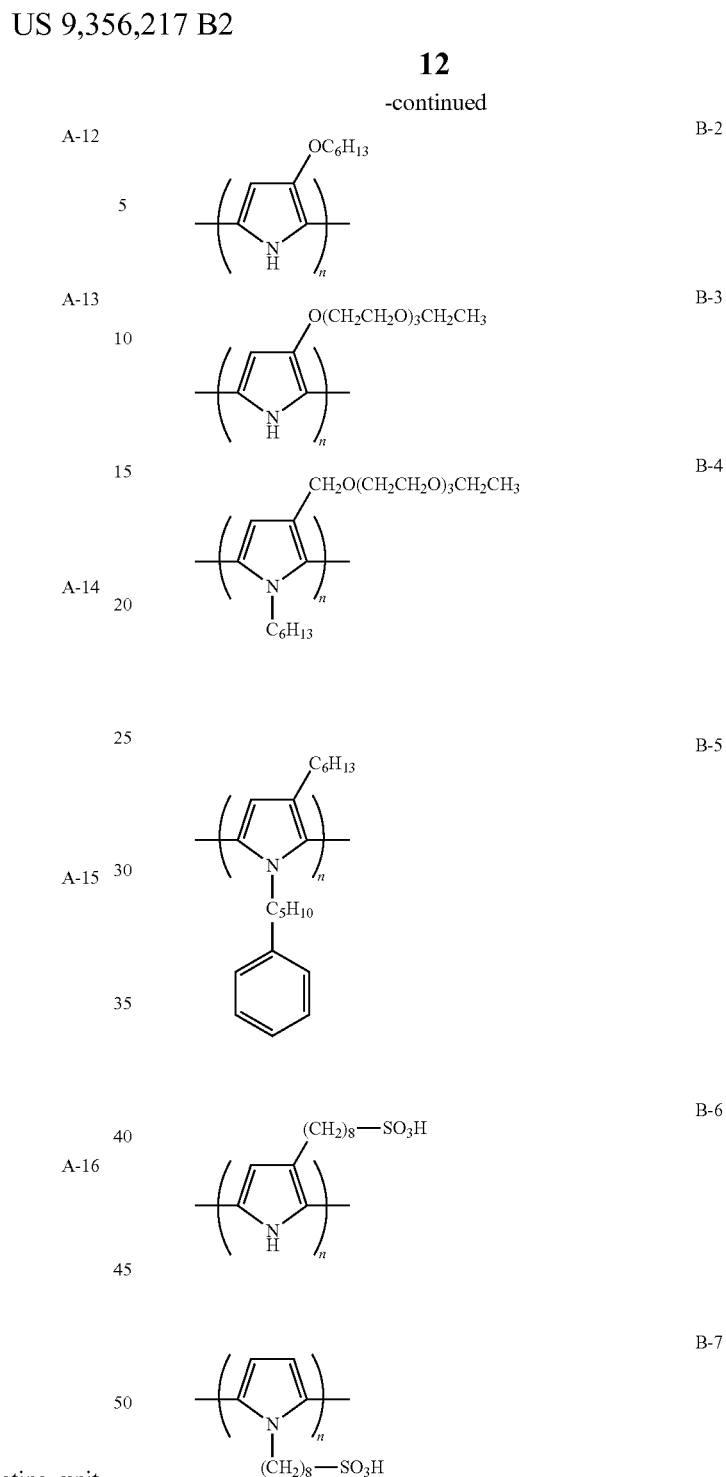

As the conjugated polymer having the repeating unit derived from the pyrrole-based compound and the derivative thereof, the following compounds can be exemplified. In the following formulae, n represents an integer of 10 or more.

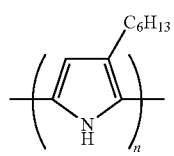

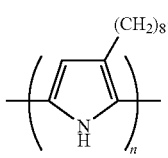

As the conjugated polymer having the repeating unit derived from the aniline-based compound and the derivative thereof, the following compounds can be exemplified. In the following formulae, n represents an integer of 10 or more.

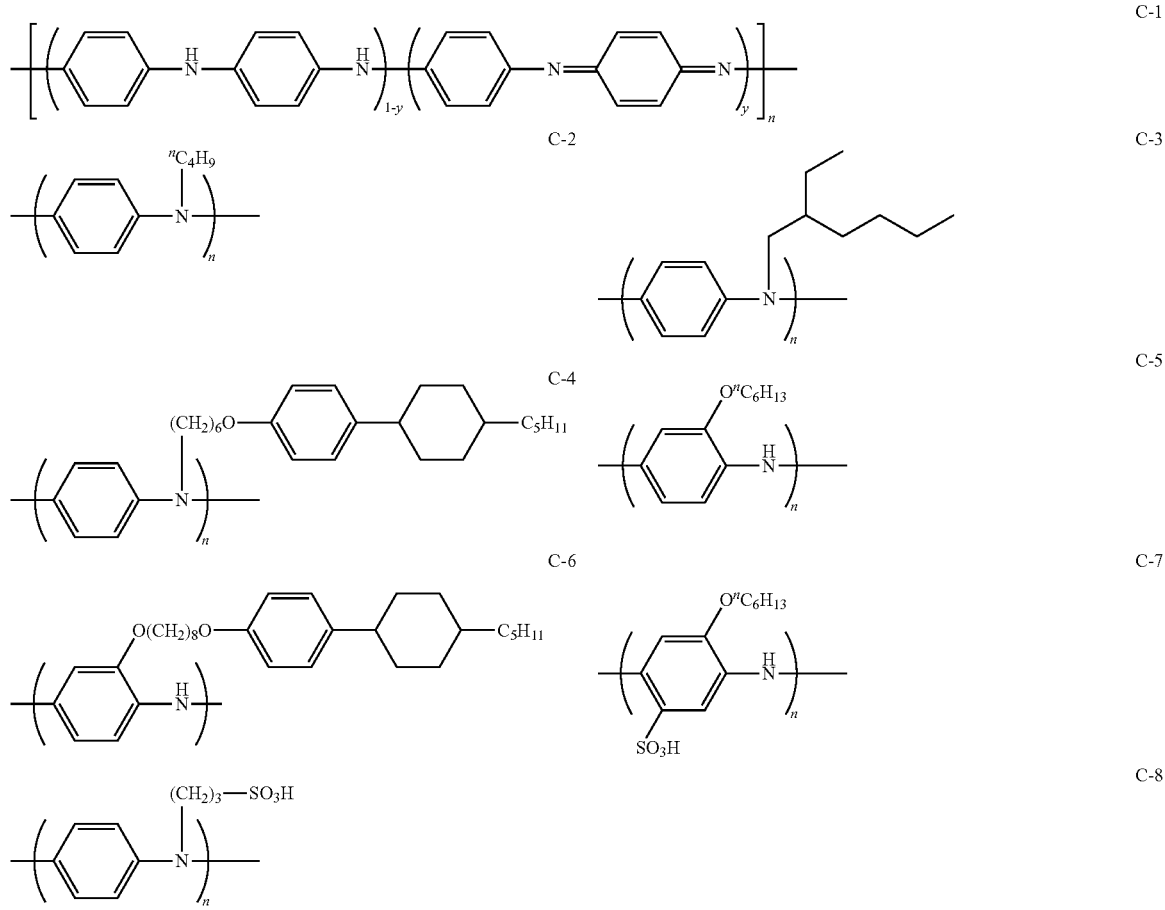

As the conjugated polymer having the repeating unit derived from the acetylene-based compound and the derivative thereof, the following compounds can be exemplified. In the following formulae, n represents an integer of 10 or more.

As the conjugated polymer having the repeating unit derived from the p-phenylene-based compound and the derivative thereof, the following compounds can be exemplified. In the following formulae, n represents an integer of 10 or more.

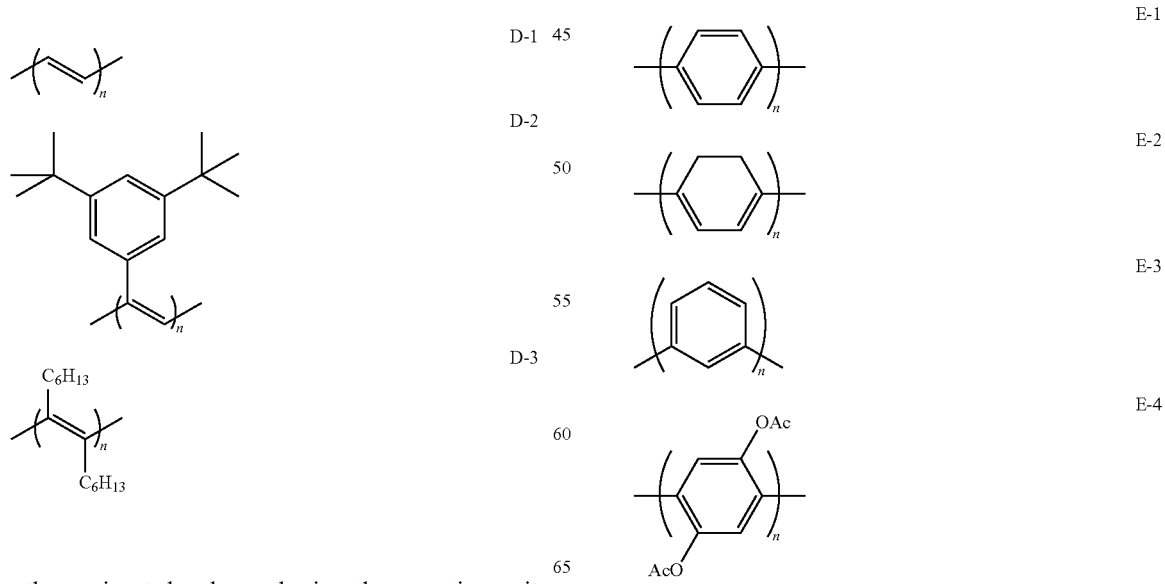

E-5
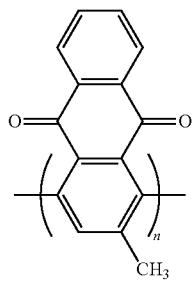

E-6
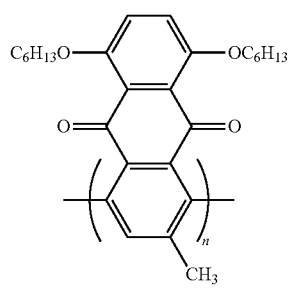

E-7
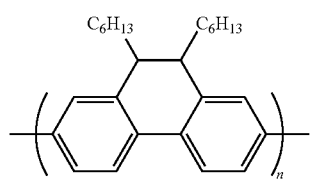

As the conjugated polymer having the repeating unit derived from the p-phenylenevinylene-based compound and the derivative thereof, the following compounds can be exemplified. In the following formulae, n represents an integer of 10 or more.

F-1
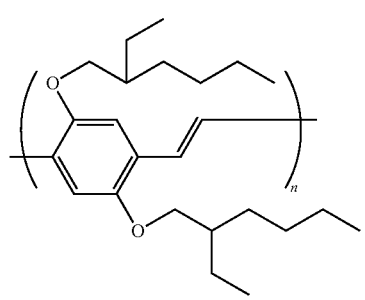

F-2
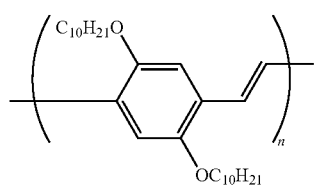

F-3
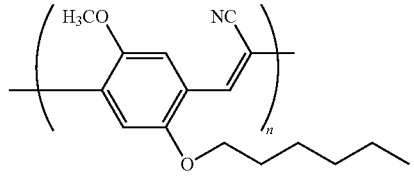

As the conjugated polymer having the repeating unit derived from the p-phenyleneethynylene-based compound and the derivative thereof, the following compounds can be exemplified. In the following formulae, n represents an integer of 10 or more.

G-1
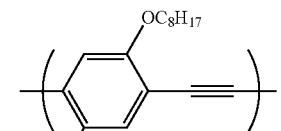

G-2
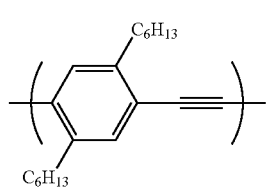

As a conjugated polymer having a repeating unit derived from a compound other than the above-described compounds and a derivative thereof, the following compounds can be exemplified. In the following formulae, n represents an integer of 10 or more.

H-1
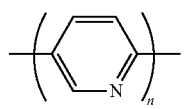

H-2
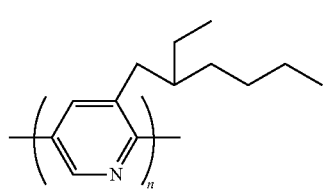

H-3
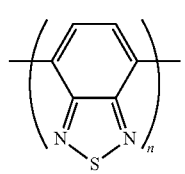

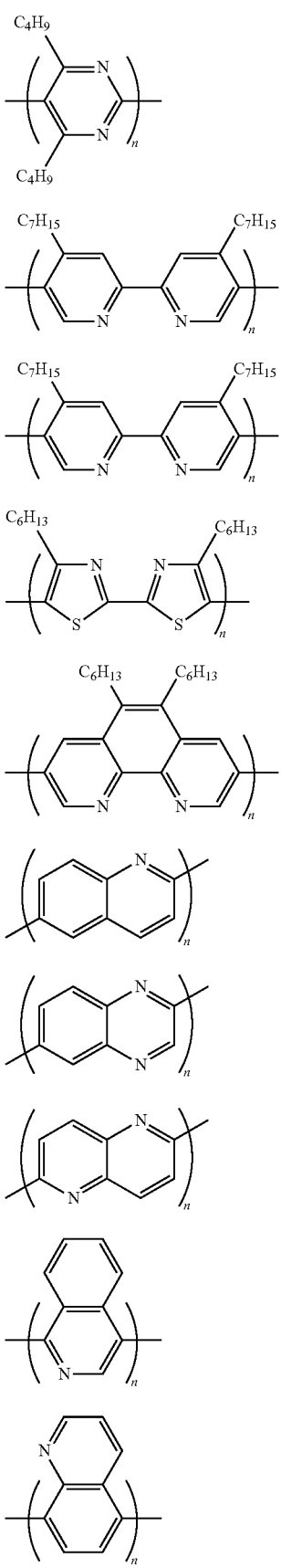

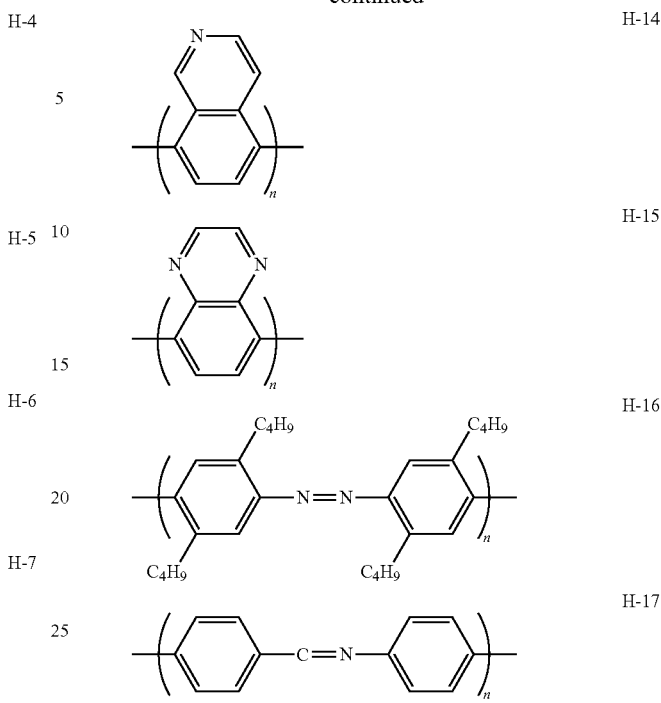

Among the above-described conjugated polymers, a linear conjugated polymer is preferably used. Such a linear conjugated polymer can be obtained, for example, in a case of the polythiophene-based polymer or the polypyrrole-based polymer, by bonding of the thiophene rings or pyrrole rings of each monomer in 2-position and 5-position, respectively. In a case of the poly-p-phenylene-based polymer, the poly-p-phenylenevinylene-based polymer, or the poly-p-phenyleneethynylene-based polymer, such a linear conjugated polymer can be obtained by bonding of the phenylene groups of each monomer in a para position (1-position and 4-position).

The electrically conductive polymer used in the present invention may have the above-mentioned repeating units (hereinafter, a monomer giving this repeating unit is also referred to as "first monomer (group of first monomers)") alone in one kind or in combination with two or more kinds. Moreover, the electrically conductive polymer may simultaneously have a repeating unit derived from a monomer having any other structure (hereinafter, also referred to as "second monomer"), in addition to the repeating unit derived from the first monomer. In a case of a polymer formed of a plurality of kinds of repeating units, the polymer may be a block copolymer, a random copolymer, or a graft polymer.

Specific examples of the second monomers having other structures used in combination with the above-described first monomer include a compound having a fluorenylene group, a carbazole group, a dibenzo[b,d]silole group, a thieno[3,2-b]thiophene group, a thieno[2,3-c]thiophene group, a benzo[1,2-b;4,5-b']dithiophene group, a cyclopenta[2,1-b;3,4-b']dithiophene group, a pyrrolo[3,4-c]pyrrole-1,4(2H,5H)-dione group, a benzo[2,1,3]thiadiazole-4,8-diyl group, an azo group, a 1,4-phenylene group, a 5H-dibenzo[b,d]silole group, a thiazole group, an imidazole group, a pyrrolo[3,4-c]pyrrole-1,4(2H,5H)-dione group, an oxadiazole group, a thiadiazole group, or a triazole group, and a derivative formed by further introducing a substituent into each of these compounds. Specific examples of the substituents to be introduced thereinto include ones similar to the above-mentioned substituents.

The electrically conductive polymer used in the present invention has the repeating units derived from one kind or a plurality of kinds of monomers selected from the group of first monomers in an amount of preferably 50% by mass or more, and more preferably 70% by mass or more, in total, in the electrically conductive polymer. The electrically conductive polymer further preferably consists of the repeating units derived from one kind or a plurality of kinds of monomers selected from the group of the first monomers. The electrically conductive polymer is particularly preferably a conjugated polymer consisting of a single repeating unit derived from a monomer selected from the group of the first monomers.

Among the groups of the first monomers, a polythiophene-based polymer including a repeating unit derived from a thiophene-based compound and/or a derivative thereof is preferably used. A polythiophene-based polymer having the thiophene rings or a thiophene ring-including condensed aromatic ring structure as represented by the structural formulae (1) to (5) below as a repeating unit, is particularly preferred.

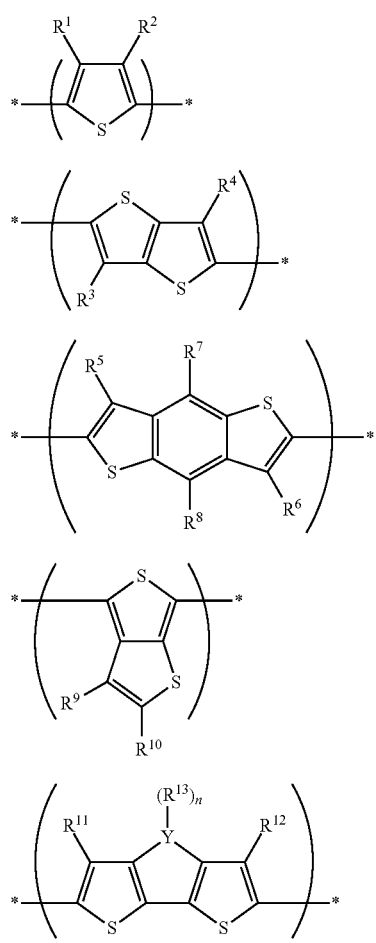

In formulae (1) to (5), $R^1$ to $R^{13}$ each independently represent a hydrogen atom, a halogen atom, an alkyl group, an alkoxy group, a perfluoroalkyl group, a perfluoroalkoxy group, an amino group, an alkylthio group, a polyalkyleneoxy group, an acyloxy group, or an alkyloxycarbonyl group; Y represents a carbon atom, a nitrogen atom, or a silicon atom; n represents an integer of 1 or 2; and a symbol "*" represents a connection site of each repeating unit.

The molecular weight of the electrically conductive polymer is not particularly limited. The electrically conductive polymer may include a high-molecular-weight one, and an oligomer having molecular weight (for example, a weight average molecular weight of about 1,000 to 10,000) less than the molecular weight of the high molecular weight one.

From a viewpoint of achieving high electrical conductivity, the electrically conductive polymer is preferably hardly degradable by acid, light, or heat. In order to achieve high electrical conductivity, intramolecular carrier transfer through a long conjugated chain of the electrically conductive polymer, and intermolecular carrier hopping are required. In order to achieve the purpose, the molecular weight of the electrically conductive polymer is preferably large to some extent. From this viewpoint, the molecular weight of the electrically conductive polymer used in the present invention is preferably 5,000 or more, more preferably 7,000 to 300, 000, and further preferably 8,000 to 100,000 in terms of weight average molecular weight. The weight average molecular weight can be measured by gel permeation chromatography (GPC).

These electrically conductive polymers can be produced by allowing polymerization of the above-described monomer being a constitutional unit by an ordinary oxidation polymerization process.

Moreover, commercially available products can also be used. A specific example includes regioregular poly(3-hexylthiophene-2,5-diyl) manufactured by Aldrich Corporation.

(C) Onium Salt Compound

The electrically conductive composition of the present invention contains an onium salt compound to allow a significant improvement in the electrical conductivity of the composition by the onium salt compound. A detail of a mechanism by which the electrical conductivity is improved is not known for certain yet, but the onium compound develops oxidation ability to the above-described CNT and/or electrically conductive polymer, as it is, or in a state in which the onium compound is activated by provision of energy such as light and heat from outside. The onium compound generates acid in such an oxidation process, and generated acid is considered to act as a dopant. The dopant allows smoother charge transfer in the electrically conductive polymer, and between the electrically conductive polymer and the CNT, and thus the electrical conductivity is improved.

According to a conventional doping technique, acid such as protonic acid and Lewis acid is used as a dopant, and therefore the CNT or the electrically conductive polymer causes aggregation, precipitation, and sedimentation at the time point of adding acid into the composition. In such a composition, the coating property or the film-forming property is poor, and as a result, the electrical conductivity is also decreased.

The onium salt compound according to the present invention is neutral and allows no aggregation, no precipitation, and no sedimentation of the CNT or the electrically conductive polymer. Moreover, the onium salt compound is also a compound from which acid is generated by provision of energy such as light and heat to allow control of timing of starting generation of acid. The composition is prepared under conditions in which acid is not generated to prevent aggregation, and thus the composition can be shaped while keeping good dispersibility and coating property. Therefore, the high electrical conductivity can be provided by providing energy as appropriate after shaping and film formation.

In the composition of the present invention, an improvement in dispersibility of the CNT is achieved by the electrically conductive polymer. Even when the onium salt compound is used together with these materials, good dispersibility and coating property can be maintained. The film quality after coating is also favorable, and the CNT, the electrically conductive polymer, and the onium salt compound are uniformly dispersed. Therefore, when external energy such as heat and light is given, when necessary, after coating, the high electrical conductivity is exhibited.

For the above reasons, the onium salt compound used in the present invention is preferably a compound having oxidation ability to the CNT and/or the electrically conductive polymer. Further, the onium salt compound used in the present invention is preferably a compound (acid generator) that generates acid by provision of energy such as light and heat. Specific examples of methods for provision of energy include irradiation with active energy rays and heating.

Specific examples of such onium salt compounds include a sulfonium salt, an iodonium salt, an ammonium salt, a carbonium salt, and a phosphonium salt. Among these, a sulfonium salt, an iodonium salt, an ammonium salt, or a carbonium salt is preferred, a sulfonium salt, an iodonium salt, or a carbonium salt is more preferred, and a sulfonium salt or a carbonium salt is particularly preferred. Specific examples of an anion part constituting such a salt include counter anions of strong acid.

Specific examples of the sulfonium salts include compounds represented by the following Formulae (I) and (II), specific examples of the iodonium salts include compounds represented by the following Formula (III), specific examples of the ammonium salts include compounds represented by the following Formula (IV), and specific examples of the carbonium salts include compounds represented by the following Formula (V), respectively, and such compounds are preferably used in the present invention.

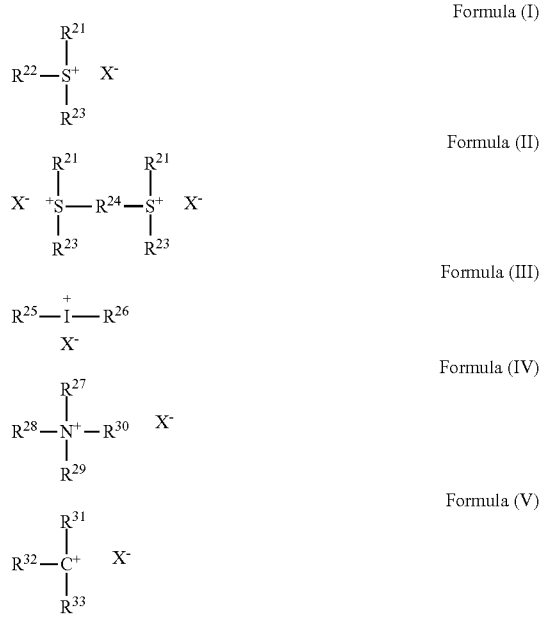

In Formulae (I) to (V), $R^{21}$ to $R^{23}$, $R^{25}$ to $R^{26}$, and $R^{31}$ to $R^{33}$ each independently represent a linear, branched, or cyclic alkyl group, aralkyl group, aryl group, or aromatic heterocyclic group. $R^{27}$ to $R^{30}$ each independently represent a hydrogen atom, or a linear, branched, or cyclic alkyl group, aralkyl group, aryl group, aromatic heterocyclic group, alkoxy group, or aryloxy group. $R^{24}$ represents a linear, branched, or cyclic alkylene group or arylene group. $R^{21}$ to $R^{33}$ may be further substituted. $X^-$ represents an anion of strong acid.

Any two groups of $R^{21}$ to $R^{23}$ in Formula (I), $R^{21}$ and $R^{23}$ in Formula (II), $R^{25}$ and $R^{26}$ in Formula (III), any two groups of $R^{27}$ to $R^{30}$ in Formula (IV), and any two groups of $R^{31}$ to $R^{33}$ in Formula (V) may be bonded with each other to form an aliphatic ring, an aromatic ring, or a heterocyclic ring.

In $R^{21}$ to $R^{23}$, or $R^{25}$ to $R^{33}$, as a linear or branched alkyl group, an alkyl group having 1 to 20 carbon atoms is preferred, and specific examples include a methyl group, an ethyl group, a propyl group, a n-butyl group, a sec-butyl group, a t-butyl group, a hexyl group, an octyl group, and a dodecyl group.

As a cycloalkyl group, an alkyl group having 3 to 20 carbon atoms is preferred. Specific examples include a cyclopropyl group, a cyclopentyl group, a cyclohexyl group, a bicyclooctyl group, a norbornyl group, and an adamantyl group.

As an aralkyl group, an aralkyl group having 7 to 15 carbon atoms is preferred. Specific examples include a benzyl group, and a phenetyl group.

As an aryl group, an aryl group having 6 to 20 carbon atoms is preferred. Specific examples include a phenyl group, a naphthyl group, an anthranyl group, a phenanthryl group, and a pyrenyl group.

Specific examples of the aromatic heterocyclic groups include a pyridyl group, a pyrazol group, an imidazole group, a benzimidazole group, an indole group, a quinoline group, an isoquinoline group, a purine group, a pyrimidine group, an oxazole group, a thiazole group, and a thiazine group.

In $R^{27}$ to $R^{30}$, as an alkoxy group, a linear or branched alkoxy group having 1 to 20 carbon atoms is preferred. Specific examples include a methoxy group, an ethoxy group, an iso-propoxy group, a butoxy group, and a hexyloxy group.

As an aryloxy group, an aryloxy group having 6 to 20 carbon atoms is preferred. Specific examples include a phenoxy group and a naphthyloxy group.

In $R^{24}$, as an alkylene group, an alkylene group having 2 to 20 carbon atoms is preferred. Specific examples include an ethylene group, a propylene group, a butylene group, and a hexylene group. As a cycloalkylene group, a cycloalkylene group having 3 to 20 carbon atoms is preferred. Specific examples include a cyclopentylene group, cyclohexylene, a bicyclooctylene group, a norbornylene group, and an adamantylene group.

As an arylene group, an arylene group having 6 to 20 carbon atoms is preferred. Specific examples include a phenylene group, a naphthylene group, and an anthranylene group.

When $R^{21}$ to $R^{33}$ further have a substituent, specific examples of preferred substituents include an alkyl group having 1 to 4 carbon atoms, an alkoxy group having 1 to 4 carbon atoms, a halogen atom (a fluorine atom, a chlorine atom, or an iodine atom), an aryl group having 6 to 10 carbon atoms, an aryloxy group having 6 to 10 carbon atoms, an alkenyl group having 2 to 6 carbon atoms, a cyano group, a hydroxyl group, a carboxy group, an acyl group, an alkoxycarbonyl group, an alkylcarbonylalkyl group, an arylcarbonylalkyl group, a nitro group, an alkylsulfonyl group, a trifluoromethyl group, and —S—$R^{41}$. In addition, $R^{41}$ has the same meaning as $R^{21}$.

As $X^-$, an anion of aryl sulfonic acid, an anion of perfluoroalkyl sulfonic acid, an anion of perhalogenated Lewis acid, an anion of perfluoroalkyl sulfonimide, an anion of perhalogenated acid, or an anion of alkyl or aryl borate is preferred. These anions may further have a substituent, and a specific example of the substituent includes a fluoro group.

Specific examples of the anions of aryl sulfonic acid include p-CH$_3$C$_6$H$_4$SO$_3^-$, PhSO$_3^-$, an anion of naphthalene sulfonic acid, an anion of naphthoquinone sulfonic acid, an anion of naphthalene disulfonic acid, and an anion of anthraquinone sulfonic acid.

Specific examples of the anions of perfluoroalkyl sulfonic acid include CF$_3$SO$_3^-$, C$_4$F$_9$SO$_3^-$, and C$_8$F$_{17}$SO$_3^-$.

Specific examples of the anions of perhalogenated Lewis acid include PF$_6^-$, SbF$_6^-$, BF$_4^-$, AsF$_6^-$, and FeCl$_4^-$.

Specific examples of the anions of perfluoroalkyl sulfonimide include CF$_3$SO$_2$—N$^-$—SO$_2$CF$_3$, and C$_4$F$_9$SO$_2$—N$^-$—SO$_2$C$_4$F$_9$.

Specific examples of the anions of perhalogenated acid include ClO$_4^-$, BrO$_4^-$, and IO$_4^-$.

Specific examples of the anions of alkyl or aryl borate include (C$_6$H$_5$)$_4$B$^-$, (C$_6$F$_5$)$_4$B$^-$, (p-CH$_3$C$_6$H$_4$)$_4$B$^-$, and (C$_6$H$_4$F)$_4$B$^-$.

X$^-$ is more preferably an anion of perhalogenated Lewis acid, or an anion of alkyl or aryl borate in which a fluoro group is substituted, further preferably an anion of fluoro-substituted aryl borate, and particularly preferably an anion of pentafluorophenyl borate.

Specific examples of the onium salt compounds are shown below, but the present invention is not limited thereto.

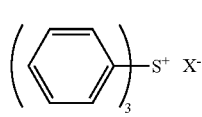
(I-1)

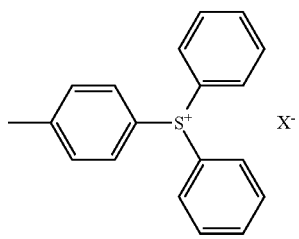
(I-2)

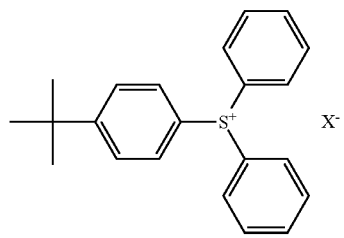
(I-3)

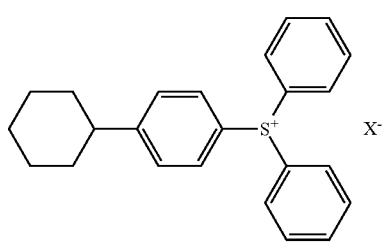
(I-4)

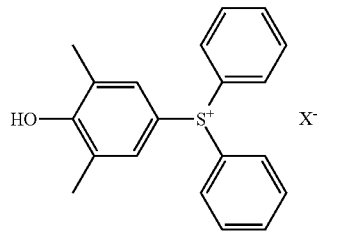
(I-5)

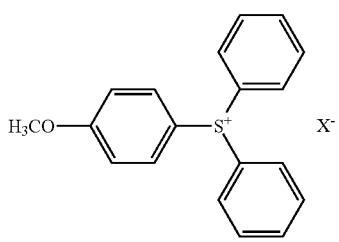
(I-6)

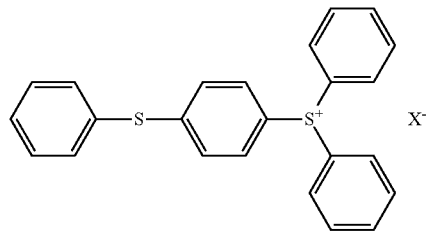
(I-7)

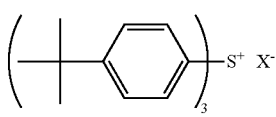
(I-8)

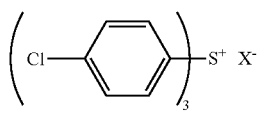
(I-9)

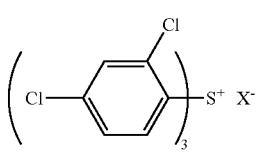
(I-10)

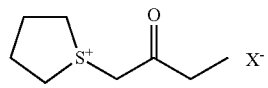
(I-11)

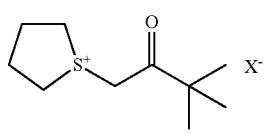
(I-12)

-continued
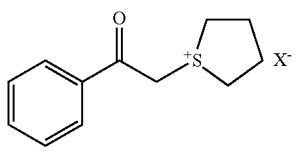
(I-13)
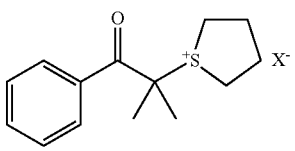
(I-14)
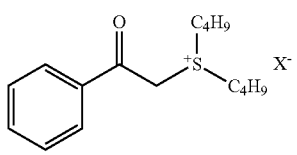
(I-15)
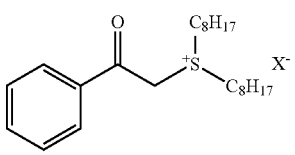
(I-16)
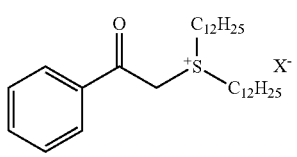
(I-17)
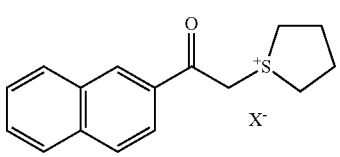
(I-18)
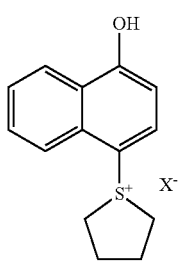
(I-19)
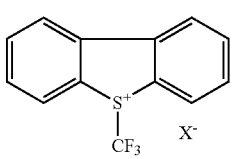
(I-20)
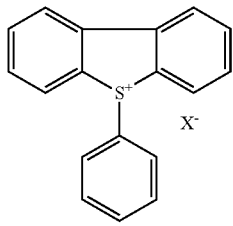
(I-21)
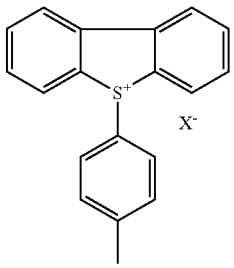
(I-22)
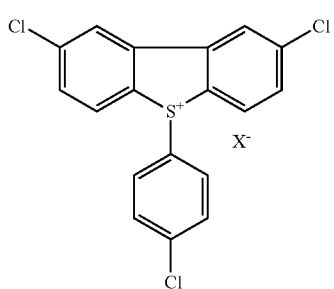
(I-23)
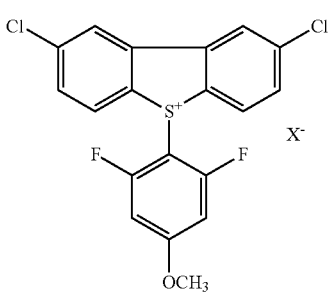
(I-24)
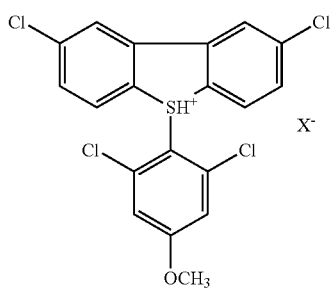
(I-25)
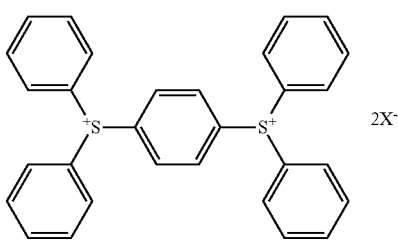
(II-1)

-continued
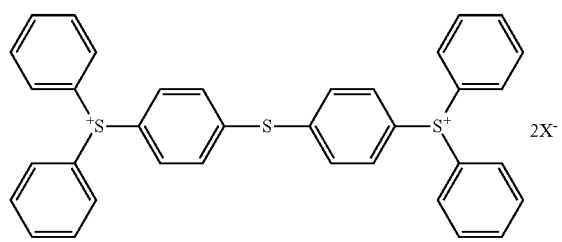
(II-2)
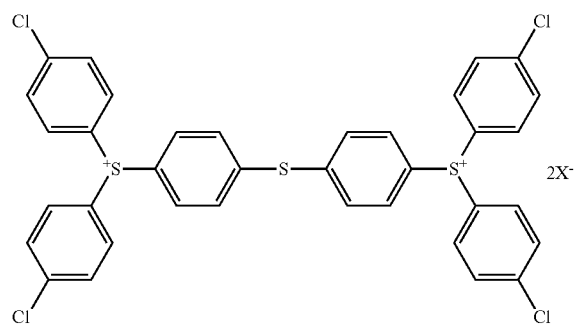
(II-3)
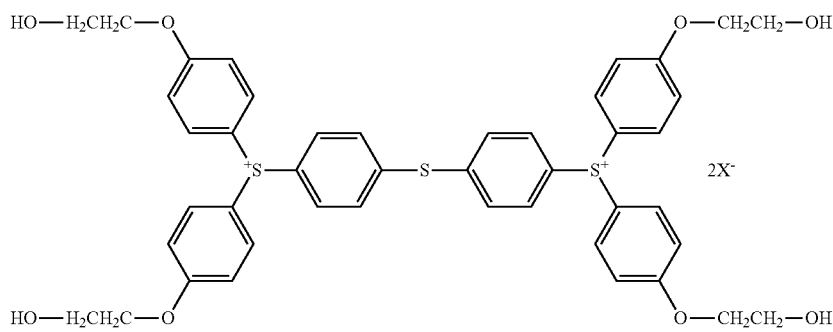
(II-4)
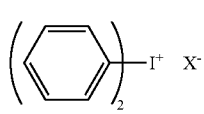
(III-1)
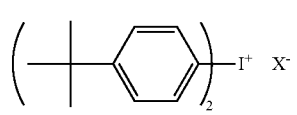
(III-2)
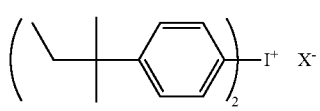
(III-3)
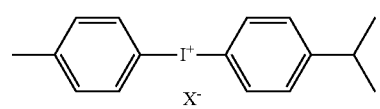
(III-4)
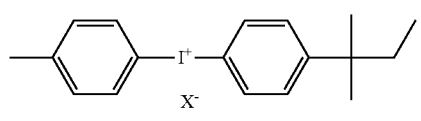
(III-5)
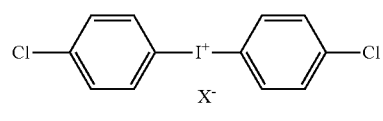
(III-6)
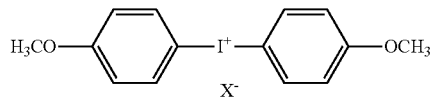
(III-7)
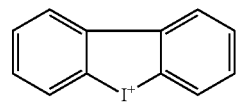
(III-8)
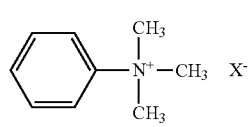
(IV-1)
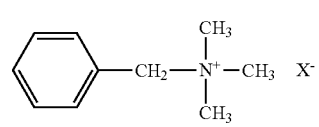
(IV-2)
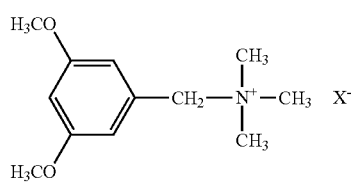
(IV-3)
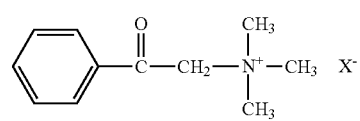
(IV-4)
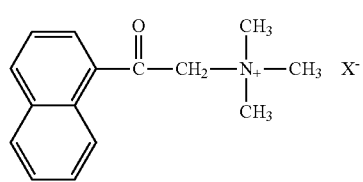
(IV-5)
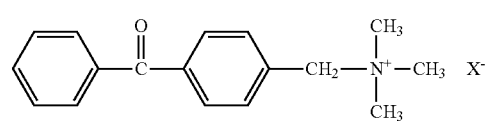
(IV-6)

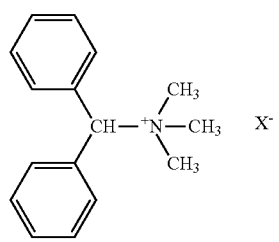 (IV-7)
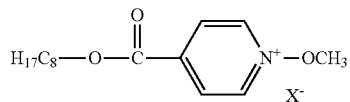 (IV-9)
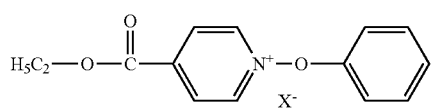 (IV-11)
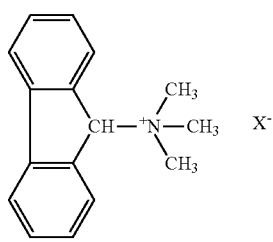 (IV-8)
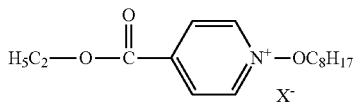 (IV-10)
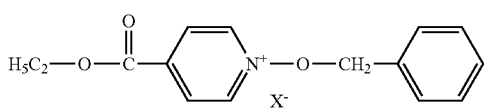 (IV-12)
(V-1)
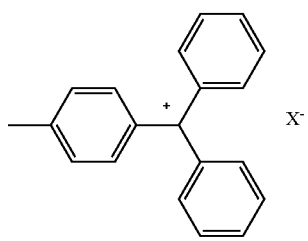 (V-2)
(V-3)
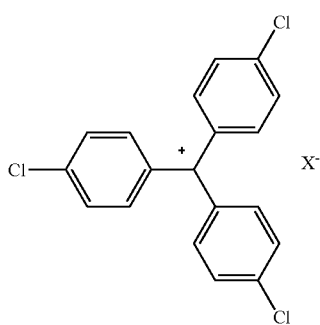 (V-4)
(V-5)
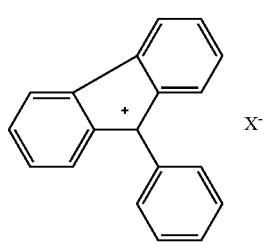 (V-6)

-continued

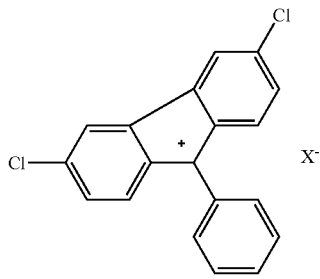
(V-7)

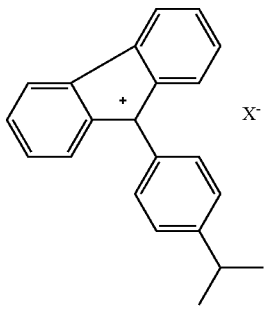
(V-8)

In the above-described specific examples, X⁻ represents $PF_6^-$, $SbF_6^-$, $CF_3SO_3^-$, $CH_3PhSO_3^-$, $BF_4^-$, $(C_6H_5)_4B^-$, $RfSO_3^-$, $(C_6F_5)_4B^-$, or an anion represented by the following formula: and

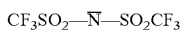

Rf represents a perfluoroalkyl group having an arbitrary substituent.

In the present invention, an onium salt compound represented by the following Formula (VI) or (VII) is particularly preferred.

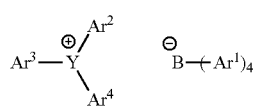
Formula (VI)

In Formula (VI), Y represents a carbon atom or a sulfur atom, $Ar^1$ represents an aryl group, and $Ar^2$ to $Ar^4$ each independently represent an aryl group or an aromatic heterocyclic group. $Ar^1$ to $Ar^4$ may further have a substituent.

$Ar^1$ preferably includes a fluoro-substituted aryl group; more preferably, a pentafluorophenyl group or a phenyl group replaced by at least one perfluoroalkyl group; and particularly preferably, a pentafluorophenyl group.

The aryl groups or the aromatic heterocyclic groups of $Ar^2$ to $Ar^4$ have the same meaning as the aryl groups or the aromatic heterocyclic groups of $R^{21}$ to $R^{23}$, or $R^{25}$ to $R^{33}$, and are preferably an aryl group, and more preferably a phenyl group. These groups may further have a substituent, and specific examples of the substituents include the above-mentioned substituents of $R^{21}$ to $R^{33}$.

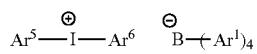
Formula (VII)

In Formula (VII), $Ar^1$ represents an aryl group, and $Ar^5$ and $Ar^6$ each independently represent an aryl group or an aromatic heterocyclic group. $Ar^1$, $Ar^5$, and $Ar^6$ may further have a substituent.

$Ar^1$ has the same meaning as $Ar^1$ in Formula (VI), and a preferred range thereof is also the same.

$Ar^5$ and $Ar^6$ each have the same meaning as $Ar^2$ to $Ar^4$ in Formula (VI), and a preferred range thereof is also the same.

The onium salt compound can be produced by an ordinary chemical synthesis. Moreover, a commercially available reagent or the like can also be used.

One embodiment of a synthetic method of the onium salt compound is represented below, but the present invention is in no way limited thereto. Any other onium salt compound can also be synthesized by a similar technique.

Into a 500 mL volume three-necked flask, 2.68 g of triphenylsulfonium bromide (manufactured by Tokyo Chemical Industry Co., Ltd.), 5.00 g of a lithium tetrakis(pentafluorophenyl)borate-ethyl ether complex (manufactured by Tokyo Chemical Industry Co., Ltd.), and 146 mL of ethanol are put, the resultant mixture is stirred at room temperature for 2 hours, and then 200 mL of pure water is added thereto, and a precipitated white solid is fractionated by filtration. This white solid is washed with pure water and ethanol, and subjected to vacuum drying, and thus as an onium salt 6.18 g of triphenylsulfonium tetrakis(pentafluorophenyl)borate can be obtained.

The onium salt compounds can be used alone in one kind or in combination with two or more kinds.

[Solvent]

The electrically conductive composition of the present invention preferably contains a solvent in addition to the CNT, the electrically conductive polymer and the onium salt compound.

The solvent only needs to allow good dispersion or dissolution of the CNT, the electrically conductive polymer and the onium salt compound, and water, an organic solvent, and a mixed solvent of these solvents can be used. The solvent is preferably an organic solvent, and preferably includes alcohol; a halogen-based solvent such as chloroform; an aprotic polar solvent such as DMF, NMP, and DMSO; an aromatic solvent such as chlorobenzene, dichlorobenzene, benzene, toluene, xylene, mesitylene, tetralin, tetramethyl benzene, and pyridine; a ketone-based solvent such as cyclohexanone, acetone, and methyl ethyl ketone; and an ether-based solvent such as diethyl ether, THF, t-butyl methyl ether, dimethoxyethane, and diglyme; and more preferably, a halogen-based solvent such as chloroform; an aprotic polar solvent such as DMF and NMP; an aromatic solvent such as dichlorobenzene, xylene, tetralin, and tetramethyl benzene; and an ether-based solvent such as THF.

Moreover, it is preferred that the solvent is previously degassed. A dissolved oxygen concentration in the solvent is preferably adjusted to be 10 ppm or less. Specific examples of methods of degasification include a method of irradiation with ultrasonic waves under reduced pressure, and a method of bubbling an inert gas such as argon.

Further, it is preferred that the solvent is previously dehydrated. The moisture content in the solvent is preferably adjusted to be 1,000 ppm or less, and more preferably, to be 100 ppm or less. As a method of dehydration, a known method, such as a method using a molecular sieve, and distillation, can be applied.

[Other Component]

In addition to each of the above-described components, the electrically conductive composition of the present invention may contain any other component.

For example, in order to improve dispersion stability, lithium hydroxide, ammonium persulfate, an ultraviolet ray absorber, or the like can be incorporated thereinto. Moreover, from a viewpoint of improving film strength, inorganic particulates, polymer particulates, a silane coupling agent, or the like can be incorporated thereinto; from viewpoints of decreasing a refractive index and improving transparency, a fluorine-based compound or the like can be incorporated thereinto; and from a viewpoint of preventing unevenness during coating, a fluorine-based surfactant or the like can be incorporated thereinto as appropriate according to a use.

The content of these components is preferably from 0.1 to 5% by mass based on the total mass of the composition.

[Preparation of Electrically Conductive Composition]

The electrically conductive composition of the present invention is formed by containing a CNT, an electrically conductive polymer and an onium salt compound, and adding a solvent when necessary. The composition of the present invention is preferably in the form of a CNT-dispersed liquid in which the CNT is dispersed in the solvent.

With regard to the composition of the present invention, the electrical conductivity and the semiconductor characteristics of the composition can be controlled by changing the content of the CNT. The content of the CNT, the electrically conductive polymer, and the onium salt compound in the composition can be selected and determined as appropriate according to a use of the composition, and characteristics required for the use, such as the electrical conductivity and the transparency.

The content of the CNT in the composition is preferably 3 to 50% by mass, more preferably 5 to 40% by mass, and further preferably 10 to 30% by mass, in the total solid content of the composition. The content of the electrically conductive polymer in the composition is preferably 30 to 80% by mass, more preferably 35 to 75% by mass, and further preferably 40 to 70% by mass, in the total solid content of the composition. The content of the onium salt compound in the composition is preferably 1 to 50% by mass, more preferably 5 to 45% by mass, and further preferably 10 to 40% by mass, in the total solid content of the composition.

When a solvent is used, the amount of the solvent is preferably 60 to 99.9% by mass, more preferably 70 to 99.5% by mass, and further preferably 80 to 99% by mass, based on the total weight of the total solid content and the solvent of the composition of the present invention.

The electrically conductive composition of the present invention can be prepared by mixing each of the above-described components. The electrically conductive composition is preferably prepared by adding the CNT, the electrically conductive polymer, and the onium salt compound to the solvent to allow dispersion of these materials by an ordinary method. The order of addition and mixing of each component is not particularly limited, but preferably a predetermined amount of the electrically conductive polymer is previously added to the solvent, and then a predetermined amount of the CNT is added.

The method of preparation is not particularly limited, and an ordinary method can be applied. For example, a dispersion method such as a mechanical homogenizer process, a jaw-crusher process, an ultracentrifugation mill process, a cutting mill process, an automatic mortar process, a disc mill process, a ball mill process, and an ultrasonic dispersion process can be applied. Moreover, two or more of these methods may be combined, when necessary. A preferred combination of dispersion methods includes a combination of the mechanical homogenizer process and the ultrasonic dispersion process. The order of combination may be arbitrary, and includes a method of dispersion by sequentially applying different dispersion methods, or a method of dispersion by simultaneously applying different dispersion methods. The order preferably includes dispersion by a method of dispersion having weaker dispersion energy, first, and then a method of dispersion having higher dispersion energy. Thus, the CNT can be dispersed at a high concentration without a defect. Specifically, the mechanical homogenizer process, first, and then the ultrasonic dispersion process are preferably combined.

Moreover, when the onium salt compound to be used is a compound that generates acid by provision of energy such as heat and light, the composition is preferably prepared in a state of shielding radiation, electromagnetic waves, or the like, or under a temperature at which no acid is formed. Aggregation by acid, or the like can be prevented, and uniform dispersibility or solubility of each component in the composition can be kept during preparation and storage of the composition.

The composition can be prepared under atmospheric air, but preferably in an inert atmosphere. The inert atmosphere means a state in which an oxygen concentration is less than a concentration in atmospheric air. The atmosphere preferably has an oxygen concentration of 10% or less. A specific method of achieving the inert atmosphere includes a method of replacing atmospheric air by a gas such as nitrogen and argon, which is preferably applied.

Moreover, temperature during preparation is preferably in the range of 0° C. to 50° C.

The CNT contained in the electrically conductive composition obtained may occasionally contain a defective CNT. Such a defect of the CNT decreases the electrical conductivity of the composition, and therefore is preferably reduced. An amount of defects of the CNT in the composition can be estimated by a G/D ratio in terms of a ratio of G-band to a D-band of a Raman spectrum. As the G/D ratio is higher, a CNT material can be estimated to have a lower amount of defects. In the present invention, the G/D ratio in the composition is preferably 10 or more, and more preferably 30 or more.

[Electrically Conductive Film]

The electrically conductive film of the present invention is formed by using the above-described electrically conductive composition. The method of producing the electrically conductive film is not particularly limited, if the electrically conductive composition is shaped. The electrically conductive composition is preferably coated onto a substrate to allow film formation.

The thus formed electrically conductive film is preferably further provided with energy such as heat and active energy rays after shaping.

[Film Formation]

A method for forming the electrically conductive film is not particularly limited, but known coating methods, such as a spin coating, extrusion die coating, blade coating, bar coating, screen printing, stencil printing, roll coating, curtain coating, spray coating, dip coating, and ink jet process can be used.

After coating, when necessary, a drying step is applied. For example, the solvent can be vaporized and dried by blowing hot air.

An amount of the electrically conductive composition to be used is adjusted as appropriate depending on desired film thickness. The thickness of the electrically conductive film may be selected as appropriate according to a use. For example, when the film is used for a transparent electrode, a resistance value and luminous transmittance become important. In a case of the transparent electrode for a display unit for an LCD, a PDP, an EL device, or the like, a preferred resistance value is in the range of 0.001 to 100,000 Ω/square, and more preferably in the range of 0.1 to 10,000 Ω/square. The luminous transmittance at 550 nm is in the range of about 40% to about 100%, preferably in the range of 50 to 100%, and more preferably in the range of 60 to 100%. The film thickness is adjusted as appropriate so as to meet these ranges in consideration of a concentration of the CNT, the electrically conductive polymer or the onium salt compound.

After film formation, the electrical conductivity of the film is preferably improved by irradiating the film with active energy rays or heating the film.

The active energy rays include radiation and electromagnetic waves, and the radiation includes particle beams (high-speed particle beams) and electromagnetic radiation. Specific examples of the particle beams include charged particle beams such as alpha rays ($\alpha$-rays), beta rays ($\beta$-rays), proton beams, electron beams (meaning ones accelerating an electron by means of an accelerator without depending on nuclear decay), and deuteron beams; non-charged particle beams such as neutron beams; and cosmic rays. Specific examples of the electromagnetic radiation include gamma rays ($\gamma$-rays) and X-rays (X-rays and soft X-rays). Specific examples of the electromagnetic waves include radio waves, infrared rays, visible rays, ultraviolet rays (near-ultraviolet rays, far-ultraviolet rays, and extreme ultraviolet rays), X-rays, and gamma rays. Types of active energy rays used in the present invention are not particularly limited. For example, electromagnetic waves having a wavelength near a maximum absorption wavelength of the onium salt compound (acid generator) to be used may be selected as appropriate.

Among these active energy rays, from viewpoints of the doping effect and safety, ultraviolet rays, visible rays, or infrared rays are preferred. Specifically, the active energy rays include rays having a maximum emission wavelength in the range of 240 to 1,100 nm, preferably in the range of 240 to 850 nm, and more preferably in the range of 240 to 670 nm.

For irradiation with active energy rays, radiation equipment or electromagnetic wave irradiation equipment is used. A wavelength of radiation or electromagnetic waves for irradiation is not particularly limited, and one allowing radiation or electromagnetic waves in a wavelength region corresponding to a response wavelength of the onium salt compound to be used may be selected.

Specific examples of the equipment allowing radiation or irradiation with electromagnetic waves include exposure equipment using as a light source an LED lamp, a mercury lamp such as a high-pressure mercury lamp, an ultra-high pressure mercury lamp, a Deep UV lamp, and a low-pressure UV lamp, a halide lamp, a xenon flash lamp, a metal halide lamp, an excimer lamp such as an ArF excimer lamp and a KrF excimer lamp, an extreme ultraviolet ray lamp, electron beams, and an X-ray lamp. Irradiation with ultraviolet rays can be applied using ordinary ultraviolet ray irradiation equipment such as commercially available ultraviolet ray irradiation equipment for curing/bonding/exposure use (for example, 5P9-250UB, USHIO INC.).

Exposure time and an amount of light may be selected as appropriate in consideration of a kind of onium salt compound to be used and the doping effect. Specific examples of the amount of light include 10 mJ/cm$^2$ to 10 J/cm$^2$, and preferably 50 mJ/cm$^2$ to 5 J/cm$^2$.

With regard to doping by heating, a substrate having an electrically conductive composition coated thereon (formed film) may be heated to a temperature at which the onium salt compound generates acid, or higher. A heating temperature is preferably 50° C. to 200° C., and more preferably 70° C. to 150° C. Heating time is preferably 1 minute to 60 minutes, and more preferably 3 minutes to 30 minutes.

[Substrate]

The substrate can be selected according to a use or the like of the electrically conductive film of the present invention. For example, when the electrically conductive film of the present invention is used as an electrode for a display unit such as an LCD, an electrophoretic display material, electronic paper, and an organic EL device, a glass substrate or a plastic substrate can be preferably used. Moreover, a metal substrate having an insulating film between the substrate and the electrically conductive film can also be used. In addition, the substrate is not limited to a plate shape, but can be selected from one having a curved surface, one having an uneven surface, or the like, according to a use. Moreover, for a thermoelectric conversion use of the electrically conductive film of the present invention, a substrate prepared by arranging various kinds of electrode materials on a surface on which the electrically conductive film is subjected compression bonding, can be suitably used. As the electrode materials, such material can be used as a transparent electrode material such as ITO and ZnO, a metal electrode material such as silver, copper, gold, and aluminum, a carbon material such as a CNT and graphene, an organic material such as PEDOT/PSS, an electrically conductive paste into which electrically conductive particulates such as silver and carbon particulates are dispersed, and an electrically conductive paste containing metal nanowires of silver, copper, or aluminum.

When heating or light irradiation is applied after coating or film formation, a substrate that is less susceptible to these stimuli is preferably selected. Specific examples of the substrates that can be used in the present invention include a substrate made of glass, transparent ceramics, a metal, or a plastic film. The glass or the transparent ceramics have poorer flexibility in comparison with the metal or the plastic film. Moreover, when the metal and the plastic film are compared in terms of prices, the plastic film is less expensive, and has higher flexibility, and therefore is preferred.

From such viewpoints, as the substrate according to the present invention, a plastic film (resin film) of a polyester-based resin, polyimide, polycarbonate, polypropylene, polyether sulfone, a cycloolefin polymer, or the like is preferred, and a polyester-based resin (hereinafter, occasionally referred to as "polyester") is particularly preferred. As the polyester, linear saturated polyester synthesized from aromatic dibasic acid or an ester-forming derivative thereof, and diol or an ester-forming derivative thereof is preferred.

Specific examples of the polyester that can be used in the present invention include polyethylene terephthalate, polyethylene isophthalate, polyethylene naphthalate, polybutylene terephthalate, poly(1,4-cyclohexylenedimethylene-terephthalate), and polyethylene-2,6-phtalenedicarboxylate. Among them, polyethylene terephthalate, polyethylene naphthalate, or the like is preferred from viewpoints of easy availability, economic efficiency, and an effect thereof.

Moreover, unless advantageous effects of the present invention are adversely affected, a copolymer of the above-described resin, or a blend of these resins and any other kind of resins can also be used.

Further, in order to improve slip properties, a small amount of inorganic or organic fine particles may be incorporated into this polyester film. The particles include an inorganic filler such as titanium oxide, calcium carbonate, silica, barium sulfate, and silicone; an organic filler such as acryl, benzoguanamine, Teflon (registered trade name), and epoxy; and a bonding property improver and an antistatic agent, such as polyethylene glycol (PEG) and sodium dodecylbenzene-sulfonate.

The polyester film used in the present invention can be formed by processing the above-described polyester resin into a film form by melting extrusion, orientation and crystallization by biaxial stretching in both horizontal and vertical directions, and crystallization by heat treatment. With regard to methods for producing these films, a known method or conditions can be selected as appropriate and used.

The thickness of the polyester film used herein is not particularly limited, and can be selected as appropriate according to the purpose of using the film, but generally a 5 to 500 μm-thick one is preferably used.

The substrate preferably further contains an additive such as an ultraviolet ray absorber. As the ultraviolet ray absorber, an oxazol-based, triazine-based, stilbene-based, or coumarin-based absorber can be preferably used.

In the present invention, when necessary, pretreatment may be applied to the substrate. For example, a known pretreatment method such as corona treatment, plasma treatment, UV-ozone treatment, and EB irradiation treatment can be applied. These types of treatment allow formation on the substrate surface a hydroxyl group, a carboxyl group, a basic group or the like having polarity, and an improvement in adhesion to the electrically conductive film. Alternatively, in order to improve adhesion to the electrically conductive film, an easy-bonding layer can be arranged on the substrate.

Specific examples of the easy-bonding layers include a layer of gelatin, polyacrylic acid, polyacrylate, a styrene-butadiene copolymer (hereinafter, abbreviated as "SBR" as appropriate), and an aqueous urethane resin. Further, the layers may further contain a crosslinking agent.

The styrene-butadiene copolymer prepared as a latex is preferably used. Specifically, commercial items can be used, such as NIPOL (trade name, manufactured by ZEON CORPORATION), NAUGATEX (trade name, manufactured by Sumitomo Naugatuck Co., Ltd.), CROSSLENE (trade name, manufactured by Takeda Pharmaceutical Company Ltd.), and ASAHI DOW LATEX (trade name, manufactured by ASAHI-DOW CO., LTD.), and others being sold by DIC Corporation and overseas manufacturers.

In a case of the latex, a size of dispersion particles is preferably 5 µm or less, more preferably 1 µm or less, and further preferably 0.2 µm or less. When the particle size is large, it causes aggregation in an coating step, or poor transparency, gloss, or the like of the film. Further, when the thickness of the coated layer is reduced, the particle size is required to be decreased according to the thickness.

A content ratio of styrene/butadiene in the styrene butadiene copolymer is preferably about 50/50 to about 80/20. A ratio of SBR contained in the latex is preferably 30 to 50% by weight as solid weight.

Moreover, a crosslinking agent may be added to this easy-bonding layer. As the cross linking agent, a triazine-based crosslinking agent is preferred.

[Electrically Conductive Laminate and Electrically Conductive Articles]

The electrically conductive film produced according to the above-described procedures can be used as the electrically conductive film, or also as the electrically conductive laminate as coated on the substrate. The electrically conductive laminate may further have an electrode or the like.

The electrically conductive film of the present invention has advantages of excellent dispersibility of the CNT, and a small amount of defects in the CNT contained, and a high electrical conductivity of about 10 to 2,000 S/cm can be realized by adjusting as appropriate kinds or the content of the CNTs, the electrically conductive polymers, the onium salt compounds. Therefore, the electrically conductive composition, the electrically conductive film, or the electrically conductive laminate of the present invention can be widely applied to various kinds of electrically conductive articles. For example, these materials can be suitably used for an electrode for a flat panel display for an LCD, a PDP, or an EL device, a solar cell, or a touch panel; an electrically conductive material for a condenser, a capacitor, or a secondary cell; an organic semiconductor material for a photoelectric conversion device, a piezoelectric conversion device, or a thermoelectric conversion device; a material for a light modulation device; a material for antistatic use, or the like.

[Thermoelectric Conversion Element]

The electrically conductive composition of the present invention has high electrical conductivity, and also excellent thermoelectric conversion performance, and can be suitably used as a thermoelectric conversion material. The electrically conductive film formed using the composition can be used as a thermoelectric conversion layer of a thermoelectric conversion element, and the electrically conductive laminate having the electrically conductive film and an electrode on the substrate can be used as the thermoelectric conversion element.

Thermoelectric conversion performance of the thermoelectric conversion material or thermoelectric conversion element is expressed in terms of a performance index (figure of merit) ZT represented by the equation (A) below. As shown in the equation (A), an improvement in thermopower and electrical conductivity is important for improving the thermoelectric conversion performance. The composition of the present invention can achieve high electrical conductivity without decreasing the thermopower.

$$\text{Performance index}(ZT) = S^2 \cdot \sigma \cdot T / \kappa \qquad (A)$$

Wherein in equation (A), S (V/K) represents thermopower (Seebeck coefficient), σ (S/m) represents electrical conductivity, κ (W/mK) represents thermal conductivity, and T (K): represents absolute temperature.

The thermoelectric conversion element of the present invention only needs to have the electrically conductive film of the present invention, or the electrically conductive laminate of the present invention, and the constitution is not particularly limited, but preferably has a substrate, a thermoelectric conversion layer including the electrically conductive film of the present invention, and an electrode for electrically connecting these materials.

Figure 2:
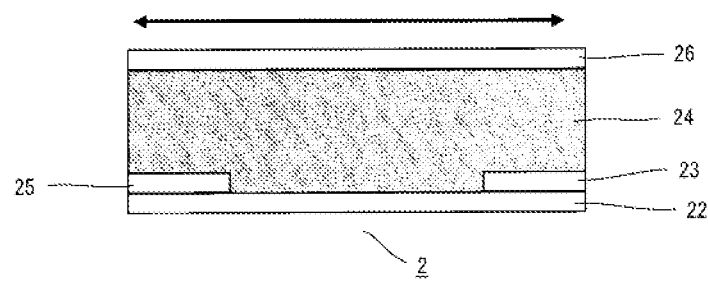
FIG. 2 is a diagram schematically showing one example of a thermoelectric conversion element of the present invention. An arrow in FIG. 2 shows a direction of temperature difference to be provided during use of the element.

One of examples of structure of the thermoelectric conversion elements of the present invention includes a structure of an element (1) shown in FIG. 1, and a structure of an element (2) shown in FIG. 2. The element (1) shown in FIG. 1 has on a first substrate (12) a pair of electrodes including a first electrode (13) and a second electrode (15), and between the electrodes the electrically conductive film of the present invention as a thermoelectric conversion layer (14). The second electrode (15) is arranged on a surface of a second substrate (16). The metal plates (17) are arranged in a manner opposite each other, on the outsides of the first substrate (12) and the second substrate (16). The element (2) shown in FIG. 2 has a first electrode (23) and a second electrode (25) arranged on a first substrate (22), and the electrically conductive film of the present invention arranged thereon as a thermoelectric conversion layer (24). In FIG. 1 and FIG. 2, arrows show directions of temperature difference, respectively, during use of the thermoelectric conversion elements.

The thermoelectric conversion element of the present invention may have the electrically conductive laminate of the present invention, and in this case, a substrate constituting the electrically conductive laminate of the present invention is preferably allowed to function as the above-described first substrate (12 or 22). More specifically, various kinds of electrode materials as mentioned above are preferably arranged on a surface (surface to be compression-bonded with the thermoelectric conversion material) of the substrate of the electrically conductive laminate of the present invention.

The thus formed thermoelectric conversion layer (electrically conductive film) has one surface covered with the substrate. Upon preparing the thermoelectric conversion element by using this layer, the substrate (second substrate (16 or 26)) is preferably compression-bonded also on the other surface from a viewpoint of protection of the film. Moreover, various kinds of electrode materials as described above may be previously arranged on a surface (surface to be compression-bonded with the thermoelectric conversion material) of the second substrate (16). Moreover, compression bonding between the second substrate and the thermoelectric conversion layer is preferably performed by heating them at about 100° C. to 200° C. from a viewpoint of an improvement in adhesion.

In the thermoelectric conversion element of the present invention, a film thickness of the thermoelectric conversion layer is preferably 0.1 µm to 1,000 µm, and more preferably 1 µm to 100 µm. A decreased film thickness is not preferred due to difficulty in provision of temperature difference, and an increase in resistance within the film.

Moreover, in view of operability, durability, or the like, a thickness of the first substrate and a thickness of the second substrate are preferably 30 to 3,000 µm, and more preferably 100 to 1,000 µm.

For forming a conversion layer, the thermoelectric conversion element generally needs only one organic layer prepared by coating, and can be further simply produced in comparison with a photoelectric conversion element such as a element for an organic thin film solar cell. In particular, if the thermoelectric conversion material according to the present invention is used, an increase in the film thickness is allowed by about 100 times to 1,000 times larger in comparison with the photoelectric conversion element such as the element for the organic thin film solar cell, and chemical stability to oxygen or moisture in air is improved.

[Thermoelectric Generator]

A thermoelectric generator of the present invention includes a product, a unit, a machine, an instrument, or the like for performing thermoelectric conversion using the thermoelectric conversion element of the present invention. More specifically, specific examples include a power generator such as a hot spring thermal power generator, a solar thermal power generator, and a cogeneration unit, and a power supply for a wrist watch, a semiconductor drive power supply, and a power supply for a small sensor.

EXAMPLES

Hereinafter, the present invention will be described in more detail based on Examples, but the invention is not intended to be limited thereto.

Example 1

To 10 mg of ASP-100F (purity: 95%, manufactured by Hanwha Nanotech Corporation) as a single-walled carbon nanotube, and 25 mg of an electrically conductive polymer 1 shown below, 10 mL of chloroform was added, and the resultant mixture was stirred for 20 minutes by means of a mechanical stirrer. Then, ultrasonic dispersion was performed at 30° C. for 40 minutes using an ultrasonic cleaner (US-2, output: 120 W, indirect irradiation, manufactured by IUCHI SEIEIDO CO., LTD.), and thus a CNT-dispersed chloroform solution was obtained. To this solution, 8 mg of the exemplified compound (I-1) as an onium salt compound was added at room temperature, and thus a chloroform solution of an electrically conductive composition was prepared. Meanwhile, as a substrate, a 1.1 mm-thick and 40 mm×50 mm glass substrate was subjected to ultrasonic cleaning in acetone, and then a cleaned glass substrate was subjected to UV-ozone treatment for 10 minutes. The above-described chloroform solution of the electrically conductive composition was subjected to spin coating (1,500 rpm, 30 seconds) on this glass substrate, and the resultant coated product was dried for 3 hours at room temperature and under vacuum conditions, and thus an electrically conductive film having a thickness of about 50 nm was formed. Then, when necessary, irradiation with ultraviolet rays (amount of light: 200 mJ/cm$^2$) was applied using an UV curing system (ECS-401GX, manufactured by EYE GRAPHICS Co., Ltd.).

An electrical conductivity, a film-forming property, and a G/D ratio of the obtained film were measured and evaluated by the following techniques. The results are shown in Table 1.

[Measurement of Electrical Conductivity]

With regard to the electrical conductivity of an electrically conductive film formed, surface resistivity (unit: Ω/square) was measured using a "high resistivity meter: Hiresta UP" or a "low resistivity meter: Loresta GP" (both are names of instruments manufactured by Mitsubishi Chemical Analytech Co., Ltd.), and film thickness (unit: cm) was measured by means of a stylus type film thickness meter, and the electrical conductivity (S/cm) was calculated from the following formula.

(Electrical conductivity)=1/((Surface electrical resistance)×(Film thickness))

[Film-forming Property]

The film-forming property was evaluated by visual observation based on criteria in three levels below.

1: Good
2: A small amount of agglomerates was observed, and a film-forming property decreased.
3: A large amount of agglomerates were observed, and a film-forming property significantly decreased.

[G/D Ratio]

A degree of defects of a CNT was evaluated by a G/D ratio using an intensity ratio of a G-band spectrum to a D-band spectrum by measuring spectra by Raman spectroscopy (wavelength: 633 nm, Laser Raman Spectrometer, manufactured by HORIBA, Ltd.) of a dispersion liquid. As the G/D ratio is smaller, the CNT has a larger amount of defects.

Examples 2 to 19

Electrically conductive films were prepared and evaluated in the same manner as Example 1 except that kinds of electrically conductive polymers and onium salt compounds were changed as shown in Table 1. The results are shown in Table 1.

| <Electrically conductive polymer> | |
|---|---|
| Electrically conductive polymer 1: Poly(3-hexylthiophene) | (Weight average molecular weight 87,000) |
| Electrically conductive polymer 2: Poly(3-dodecylthiophene) | (Weight average molecular weight 27,000) |
| Electrically conductive polymer 3: Poly(3-hexyloxythiophene) | (Weight average molecular weight 53,000) |
| Electrically conductive polymer 4: Poly(2,5-bis(3-dodecylthiophenyl) thieno[3,2-b]thiophene | (Weight average molecular weight 79,000) |

-continued

<Electrically conductive polymer>

Electrically conductive polymer 5:  (Weight average molecular
Poly(2-methoxy-5-(2-ethylhexyloxy)-  weight 110,000)
1,4-phenylenevinylene)

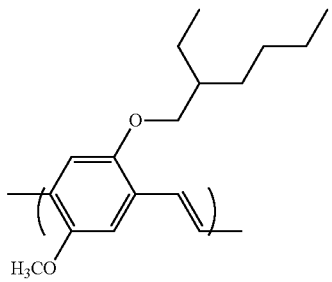

Example 20

An electrically conductive film was prepared on a glass substrate in the same manner as Example 1 except that a CNT-dispersed liquid was prepared by stirring the resultant mixture for 30 minutes using an ultrasonic processor (VCX-502, output: 250 W, direct irradiation, manufactured by TOKYO RIKAKIKAI CO., LTD.) in place of mechanical stirring for 20 minutes and subsequent stirring for 40 minutes using the ultrasonic cleaner (US-2, output: 120 W, indirect irradiation, manufactured by IUCHI SEIEIDO CO., LTD.) in Example 1, and by changing kinds of onium salt compounds as shown in Table 1. This coating film was evaluated with regard to the electrical conductivity, film-forming property, and G/D ratio in the same manner as Example 1.

Example 21

An electrically conductive film was prepared on a glass substrate in the same manner as Example 1 except that kinds of onium salt compounds were changed as shown in Table 1, and amounts of addition of the CNT, the electrically conductive polymer, and the onium salt compound were changed to 7.5 mg, 18.5 mg, and 17 mg, respectively. This coating film was evaluated with regard to the electrical conductivity, film-forming property, and G/D ratio in the same manner as Example 1.

Comparative Examples 1 to 5

Comparative coating films including a CNT and an electrically conductive polymer were prepared on a glass substrate in the same manner as Example 1 except that no dopant compound was added, or other dopant compounds shown in Table 2 were added in place of addition of the onium salt compound in Example 1. The coating films were evaluated with regard to the electrical conductivity, film-forming property, and G/D ratio in the same manner as Example 1.

TABLE 1

| Ex | Electrically conductive polymer | Additive (Onium salt compound) | Exposure | Electrical conductivity σ (S/cm) | Film-forming property | G/D ratio |
|---|---|---|---|---|---|---|
| Ex 1 | Electrically conductive polymer 1 (HT coupling ratio ≥95%) | Specific example (I-1) B(C$_6$F$_5$)$_4$ Salt | Yes | 325 | 1 | 65 |
| Ex 2 | Electrically conductive polymer 1 (HT coupling ratio ≥95%) | Specific example (I-9) B(C$_6$F$_5$)$_4$ Salt | Yes | 395 | 1 | 65 |
| Ex 3 | Electrically conductive polymer 1 (HT coupling ratio ≥95%) | Specific example (I-10) B(C$_6$F$_5$)$_4$ Salt | Yes | 360 | 1 | 65 |
| Ex 4 | Electrically conductive polymer 1 (HT coupling ratio ≥95%) | Specific example (I-9) B(C$_6$H$_5$)$_4$ Salt | Yes | 125 | 1 | 65 |
| Ex 5 | Electrically conductive polymer 1 (HT coupling ratio ≥95%) | Specific example (I-9) PF$_6$ Salt | Yes | 105 | 1 | 65 |
| Ex 6 | Electrically conductive polymer 1 (HT coupling ratio ≥95%) | Specific example (I-7) B(C$_6$F$_5$)$_4$ Salt | Yes | 375 | 1 | 65 |
| Ex 7 | Electrically conductive polymer 1 (HT coupling ratio ≥95%) | Specific example (II-2) B(C$_6$F$_5$)$_4$ Salt | Yes | 295 | 1 | 65 |
| Ex 8 | Electrically conductive polymer 1 (HT coupling ratio ≥95%) | Specific example (III-1) B(C$_6$F$_5$)$_4$ Salt | No | 220 | 1 | 65 |
| Ex 9 | Electrically conductive polymer 1 (HT coupling ratio ≥95%) | Specific example (III-4) B(C$_6$F$_5$)$_4$ Salt | Yes | 280 | 1 | 65 |
| Ex 10 | Electrically conductive polymer 1 (HT coupling ratio ≥95%) | Specific example (IV-12) B(C$_6$F$_5$)$_4$ Salt | Yes | 305 | 1 | 65 |
| Ex 11 | Electrically conductive polymer 2 (HT coupling ratio ≥95%) | Specific example (III-6) SbF$_6$ Salt | Yes | 210 | 1 | 63 |
| Ex 12 | Electrically conductive polymer 3 (HT coupling ratio ≥95%) | Specific example (III-4) CF$_3$SO$_3$ Salt | Yes | 145 | 1 | 59 |
| Ex 13 | Electrically conductive polymer 4 | Specific example (I-9) B(C$_6$F$_5$)$_4$ Salt | Yes | 480 | 1 | 68 |
| Ex 14 | Electrically conductive polymer 5 | Specific example (I-10) B(C$_6$F$_5$)$_4$ Salt | Yes | 75 | 1 | 47 |
| Ex 15 | Electrically conductive polymer 1 (HT coupling ratio ≥95%) | Specific example (III-4) B(C$_6$F$_5$)$_4$ Salt | No | 245 | 1 | 65 |
| Ex 16 | Electrically conductive polymer 4 | Specific example (III-4) B(C$_6$F$_5$)$_4$ Salt | No | 425 | 1 | 68 |
| Ex 17 | Electrically conductive polymer 1 (HT coupling ratio 60%) | Specific example (I-9) B(C$_6$F$_5$)$_4$ Salt | Yes | 65 | 1 | 37 |
| Ex 18 | Electrically conductive polymer 4 | Specific example (I-9) CF$_3$SO$_2$—N—SO$_2$CF$_3$ Salt | Yes | 95 | 1 | 68 |
| Ex 19 | Electrically conductive polymer 1 (HT coupling ratio ≥95%) | Specific example (V-1) B(C$_6$F$_5$)$_4$ Salt | Yes | 170 | 1 | 65 |

TABLE 1-continued

| Ex | Electrically conductive polymer | Additive (Onium salt compound) | Exposure | Electrical conductivity σ (S/cm) | Film-forming property | G/D ratio |
|---|---|---|---|---|---|---|
| Ex 20 | Electrically conductive polymer 1 (HT coupling ratio ≥95%) | Specific example (I-9) B(C$_6$F$_5$)$_4$ Salt | Yes | 45 | 1 | 12 |
| Ex 21 | Electrically conductive polymer 1 (HT coupling ratio ≥95%) | Specific example (I-9) B(C$_6$F$_5$)$_4$ Salt | Yes | 430 | 1 | 65 |

"Ex" means Example.

TABLE 2

| C Ex | Electrically conductive polymer | Additive (Onium salt compound) | Exposure | Electrical conductivity σ (S/cm) | Film-forming property | G/D ratio |
|---|---|---|---|---|---|---|
| C Ex 1 | Electrically conductive polymer 1 (HT coupling ratio ≥95%) | None | Yes | 2 | 1 | 65 |
| C Ex 2 | Electrically conductive polymer 1 (HT coupling ratio ≥95%) | Iodine (I$_2$) | Yes | 3 | 1 | 65 |
| C Ex 3 | Electrically conductive polymer 1 (HT coupling ratio ≥95%) | Iron chloride (FeCl$_3$) | Yes | <0.01 | 3 | 65 |
| C Ex 4 | Electrically conductive polymer 1 (HT coupling ratio ≥95%) | Camphorsulfonic acid | Yes | <0.01 | 2 | 65 |
| C Ex 5 | Electrically conductive polymer 1 (HT coupling ratio ≥95%) | HB(C$_6$F$_5$)$_4$ | Yes | <0.01 | 3 | 65 |

"C Ex" means Comparative Example.

As shown in Table 1, the electrically conductive films of Examples 1 to 21 in which the films formed using the compositions containing the CNTs, the electrically conductive polymers, and the onium salt compounds exhibited high electrical conductivity and good film-forming property. Moreover, defects of the CNTs were small in the films in Examples 1 to 19, and 21.

In contrast, in the films of Comparative Examples 1 to 5 in which the onium salt compounds were not used as shown in Table 2, the electrical conductivity significantly decreased. Further, in the films of Comparative Examples 3 to 5 in which conventional dopants such as acid and metal halide were used, the film-forming property was inferior.

Example 22

(Formation of a Thermoelectric Conversion Layer)

A form was prepared on a glass substrate using 300 μm-thick NITOFLON No. 901UL (product name, manufactured by NITTO DENKO CORPORATION) and a double-coated adhesive film. Into the form, a chloroform solution of an electrically conductive composition prepared in the same manner as Example 1 was poured, the resultant poured product was dried under room temperature, and subjected to annealing treatment for 10 minutes on a hot plate having a temperature of 80° C., the form was removed, and thus a 2.0 μm-thick thermoelectric conversion layer was formed. Then, a thermoelectric conversion element was prepared by irradiating the layer with ultraviolet rays (1 J/cm$^2$) using a UV curing system (ECS-401GX, manufactured by EYE GRAPHICS Co., Ltd.).

An electrical conductivity and a thermoelectric characteristics of the thermoelectric conversion element obtained were measured and evaluated by the following techniques. Moreover, the film-forming property was evaluated in the same manner as Example 1. The results are shown in Table 3.

[Evaluation of Electrical Conductivity and Thermoelectric Characteristics]

A Seebeck coefficient (V/k) and electrical conductivity (S/m) were measured under an air atmosphere having a temperature of 100 degrees using a thermoelectric characteristics measuring device MODEL RZ2001i (product name, manufactured by OZAWA SCIENCE CO., LTD.). From the Seebeck coefficient and the electrical conductivity obtained, as thermoelectric characteristics, a power factor (PF) was calculated according to the equation below.

PF=(Seebeck coefficient)×(Electrical conductivity)

Example 23

A thermoelectric conversion element was prepared in the same manner as Example 22 except that a chloroform solution of an electrically conductive composition prepared in the same manner as Example 5 was used, and the electrical conductivity, thermoelectric characteristics, and film-forming property were evaluated.

Example 24

A thermoelectric conversion element was prepared in the same manner as Example 22 except that a chloroform solution of an electrically conductive composition prepared in the same manner as Example 9 was used, and the electrical conductivity, thermoelectric characteristics, and film-forming property were evaluated.

Example 25

A thermoelectric conversion element was prepared in the same manner as Example 22 except that a chloroform solution of an electrically conductive composition prepared in the same manner as Example 12 was used, and the electrical conductivity, thermoelectric characteristics, and film-forming property were evaluated.

Example 26

A thermoelectric conversion element was prepared in the same manner as Example 22 except that a chloroform solution of an electrically conductive composition prepared in the same manner as Example 13 was used, and the electrical conductivity, thermoelectric characteristics, and film-forming property were evaluated.

Example 27

An o-dichlorobenzene solution of an electrically conductive composition was prepared in the same manner as Example 1 except that o-dichlorobenzene (ortho-dichlorobenzene) was used in place of chloroform. A 2.0 μm-thick thermoelectric conversion layer was formed, in the same manner as Example 22, by pouring the o-dichlorobenzene solution of the electrically conductive composition into the form, drying the resultant poured product on a hot plate at a temperature of 120° C., and then removing the form. In the later, a thermoelectric conversion element was prepared in the same manner as Example 22, and the electrical conductivity, thermoelectric characteristics, and film-forming property were evaluated.

Comparative Example 6

A thermoelectric conversion element was prepared in the same manner as Example 22 except that a chloroform solution of an electrically conductive composition prepared in the same manner as Comparative example 1 was used, and the electrical conductivity, thermoelectric characteristics, and film-forming property were evaluated.

Comparative Example 7

A thermoelectric conversion element was prepared in the same manner as Example 22 except that a chloroform solution of an electrically conductive composition prepared in the same manner as Comparative example 2 was used, and the electrical conductivity, thermoelectric characteristics, and film-forming property were evaluated.

TABLE 3

| | Solvent | Electrical conductivity (S/cm) | Thermoelectric characteristics: PF values (μW/(m·k)) | Film-forming property |
|---|---|---|---|---|
| Ex 22 | Chloroform | 320 | 40.5 | 1 |
| Ex 23 | Chloroform | 210 | 33.6 | 1 |
| Ex 24 | Chloroform | 220 | 27.0 | 1 |
| Ex 25 | Chloroform | 138 | 25.5 | 1 |
| Ex 26 | Chloroform | 350 | 38.1 | 1 |
| Ex 27 | o-Dichlorobenzene | 385 | 41.9 | 1 |
| C Ex 6 | Chloroform | 2 | 0.605 | 1 |
| C Ex 7 | Chloroform | 3 | 0.691 | 1 |

"Ex" means Example.
"C Ex" means Comparative Example.

As shown in Table 3, the thermoelectric conversion element of Examples 22 to 27 formed using the compositions containing the CNTs, the electrically conductive polymers, and the onium salt compounds exhibited high electrical conductivity and thermoelectric characteristics (PF values). In particular, the element of Example 27 prepared by using o-dichlorobenzene as the solvent exhibited higher electrical conductivity and thermoelectric characteristics, and the film-forming property was also excellent.

In contrast, in the elements of Comparative Examples 6 and 7 in which no onium salt compound was contained exhibited both the electrical conductivity and thermoelectric characteristics significantly decreased.

Example 28

An electrically conductive film was prepared on a film in the same manner as Example 1 except that a 188 μm-thick polyethylene naphthalate (PEN) film: TEONEX Q51 (product name, manufactured by TEIJIN LTD.) was used as a substrate. The electrically conductive film obtained was evaluated with regard to the electrical conductivity, film-forming property, and G/D ratio in the same manner as Example 1. The results are shown in Table 4.

TABLE 4

| | Electrical conductivity (S/cm) | Film-forming property | G/D ratio |
|---|---|---|---|
| Example 28 | 310 | 1 | 65 |

As shown in Table 4, even when the resin film was used as the substrate, the electrically conductive film formed using the electrically conductive composition of the present invention exhibited high electrical conductivity and good film-forming property, and had a small amount of defects of the CNT.

Example 29

An electrically conductive film was prepared on a film in the same manner as Example 1 except that a 125 μm-thick and indium tin oxide (ITO)-coated polyethylene terephthalate (PET) film (surface electrical resistance: 100 Ω/square, manufactured by Sigma-Aldrich Japan, K.K.) was used as a substrate. The electrically conductive film obtained was evaluated with regard to the film-forming property, and G/D ratio in the same manner as Example 1. The results are shown in Table 5.

TABLE 5

| | Film-forming property | G/D ratio |
|---|---|---|
| Example 29 | 1 | 65 |

As shown in Table 5, even when the ITO film being an electrically conductive material was used as the substrate, the electrically conductive film formed using the electrically conductive composition of the present invention exhibited good film-forming property, and had a small amount of defects of the CNT.

Example 30

An electrically conductive film was prepared in the same manner as Example 1 except that an equal amount of o-dichlorobenzene was used in place of chloroform, and the resultant coated product was dried on a hot plate at 80° C., and subjected to annealing treatment at 120° C. On both ends of the electrically conductive film, 2 mm-wide gold electrodes were formed by a vacuum deposition process. When one side of the glass substrate was heated by means of a dryer, and measurement was carried out using a tester, a voltage difference was generated depending on a temperature difference between the gold electrodes. Thus, the electrically conductive film prepared by using the electrically conductive composition of the present invention was confirmed to operate as a thermoelectric conversion element.

Example 31

A brown vial was used, and under a yellow light, 10 mL of chloroform was added as a solvent to 10 mg of ASP-100F (purity: 95%, manufactured by Hanwha Nanotech Corporation) as a single-walled carbon nanotube, and 25 mg of the above-described electrically conductive polymer 1, and the resultant mixture was stirred for 20 minutes by means of a mechanical stirrer. Then, ultrasonic dispersion was performed at 30° C. for 40 minutes using an ultrasonic cleaner (US-2, output: 120 W, indirect irradiation, manufactured by IUCHI SEIEIDO CO., LTD.), and thus a CNT-dispersed chloroform solution was obtained. To this solution, 8 mg of $B(C_6F_5)_4$ salt of the exemplified compound (I-1) as an onium salt compound was added at room temperature, and thus an electrically conductive composition solution was prepared. The thus prepared electrically conductive composition solution was sealed, and stored at room temperature (25° C.) for 24 hours under light shielding.

The electrically conductive composition solution stored for 24 hours was subjected to ultrasonic dispersion at 30° C. for 10 minutes using an ultrasonic cleaner (US-2, output: 120 W, indirect irradiation, manufactured by IUCHI SEIEIDO CO., LTD.), and then film formation was made by the following method.

(Film-forming Process)

A form was prepared on a glass substrate using 300 μm-thick NITOFLON No. 901UL (product name, manufactured by NITTO DENKO CORPORATION) and a double-coated adhesive film. Into the form, the thus prepared electrically conductive composition solution was poured, the resultant poured product was dried under room temperature (25° C.), and subjected to annealing treatment at 80° C., and the form was removed. Then, an electrically conductive film was prepared by irradiation with ultraviolet rays (1 J/cm²) using a UV curing system (ECS-401GX, manufactured by EYE GRAPHICS Co., Ltd.).

Example 32

An electrically conductive composition solution and an electrically conductive film were prepared in the same manner as Example 31 except that an equal amount of o-dichlorobenzene was used as a solvent, and the resultant poured product was dried on a hot plate at 80° C., and subjected to annealing treatment at 120° C.

Example 33

An electrically conductive composition solution and an electrically conductive film were prepared in the same manner as Example 32 except that an onium salt compound was changed to an equal amount of $PF_6$ salt of the exemplified compound (I-9).

Comparative Example 8

An electrically conductive composition solution and an electrically conductive film were prepared in the same manner as Example 32 except that an equal amount of anhydrous iron (III) chloride (manufactured by KANTO CHEMICAL CO., INC.) was used in place of the onium salt compound.

With regard to the resulting electrically conductive composition solutions and the resulting electrically conductive films, a liquid stability and a rate of change of electrical conductivity were evaluated as described below, and the film-forming property was evaluated in the same manner as Example 1.

[Evaluation of Liquid Stability]

Presence or absence of sediment in the electrically conductive composition solution stored for 24 hours was visually confirmed, and a case where no sediment was observed was judged to be good (○), and a case where sedimentation was caused was judged to be bad (×).

[Rate of Change of Electrical Conductivity]

An electrically conductive film was prepared using each of an electrically conductive composition solution immediately after preparation, and an electrically conductive composition solution after storage for 24 hours, the electrical conductivity was measured in the same manner as Example 1, and a rate of change (decrease rate) of electrical conductivity was calculated according to the equation below.

(Ratio of electrical conductivity)=(electrical conductivity of electrically conductive film using a solution stored for 24 hours)/(electrical conductivity of electrically conductive film using a solution immediately after preparation)

The rate of change of electrical conductivity was evaluated based on criteria in three levels below. A case of level 1 in evaluation indicates the highest storage stability, and a case of level 3 in evaluation indicates the lowest storage stability.

1: A case where a rate of change is 0.8 or more to 1.0;
2: A case where a rate of change is 0.6 or more and less than 0.8; and
3: A case where a rate of change is less than 0.6.

TABLE 6

| | Onium salt compound | Solvent | Liquid stability | Film-forming property | Rate of change of electrical conductivity |
|---|---|---|---|---|---|
| Ex 31 | Onium salt (I-1) $B(C_6F_5)_4$ salt | Chloroform | ○ | 1 | 2 |
| Ex 32 | Onium salt (I-1) $B(C_6F_5)_4$ salt | o-Dichlorobenzene | ○ | 1 | 1 |
| Ex 33 | Onium salt (I-9) $PF_6$ salt | o-Dichlorobenzene | ○ | 1 | 1 |
| C Ex 8 | Anhydrous iron (III) chloride | o-Dichlorobenzene | × | 3 | 3 |

"Ex" means Example.
"C Ex" means Comparative Example.

As shown in Table 6, the electrically conductive composition of the present invention containing the CNT, the electrically conductive polymer, and the onium salt compound had excellent solution stability, and exhibited excellent film-forming property even after storage for 24 hours, and also had a small decrease in the electrical conductivity. In particular, the composition prepared using o-dichlorobenzene as the solvent had a very small decrease in the electrical conductivity, and exhibited excellent storage stability.

In contrast, in the composition of Comparative Example 8 in which no onium salt compound was contained, sediment was produced during storage, the film-forming property after storage was poor, and a decrease in the electrical conductivity was significant.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2011-070393 filed in Japan on Mar. 28, 2011 and Patent Application No. 2011-238783 filed in Japan on Oct. 31, 2011, which are entirely herein incorporated by reference.

REFERENCE SIGNS LIST

1, 2 Thermoelectric conversion element
11, 17 Metal plate
12, 22 First substrate
13, 23 First electrode
14, 24 Thermoelectric conversion layer
15, 25 Second electrode
16, 26 Second substrate

The invention claimed is:

1. An electrically conductive composition, comprising (A) a carbon nanotube in an amount of 3 to 50% by mass, (B) an electrically conductive polymer in an amount of 30 to 80% by mass, and (C) an onium salt compound in an amount of 1 to 50% by mass, in the total solid content of the electrically conductive composition.

2. The electrically conductive composition according to claim 1, wherein (C) the onium salt compound is a compound having oxidation ability to (A) the carbon nanotube and/or (B) the electrically conductive polymer.

3. The electrically conductive composition according to claim 1, wherein (C) the onium salt compound is a compound that generates acid by provision of heat or irradiation with active energy rays.

4. The electrically conductive composition according to claim 1, wherein (C) the onium salt compound is a compound represented by any one of Formulae (I) to (V);

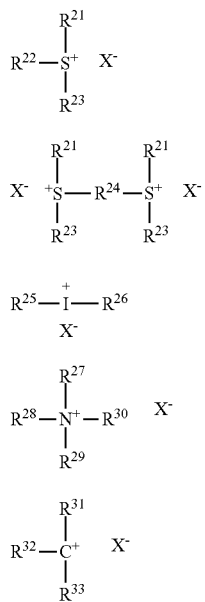

Formula (I)
Formula (II)
Formula (III)
Formula (IV)
Formula (V)

wherein in Formulae (I) to (V), $R^{21}$ to $R^{23}$, $R^{25}$ to $R^{26}$, and $R^{31}$ to $R^{33}$ each independently represent a linear, branched, or cyclic alkyl group, aralkyl group, aryl group, or aromatic heterocyclic group; $R^{27}$ to $R^{30}$ each independently represent a hydrogen atom, or a linear, branched, or cyclic alkyl group, aralkyl group, aryl group, aromatic heterocyclic group, alkoxy group, or aryloxy group; $R^{24}$ represents a linear, branched, or cyclic alkylene group or arylene group; $R^{21}$ to $R^{33}$ may be further substituted;

$X^-$ represents an anion of strong acid; and any two groups of $R^{21}$ to $R^{23}$ in Formula (I), $R^{21}$ and $R^{23}$ in Formula (II), $R^{25}$ and $R^{26}$ in Formula (III), any two groups of $R^{27}$ to $R^{30}$ in Formula (IV), or any two groups of $R^{31}$ to $R^{33}$ in Formula (V) may be bonded with each other to form an aliphatic ring, an aromatic ring, or a heterocyclic ring.

5. The electrically conductive composition according to claim 4, wherein, in Formulae (I) to (V), $X^-$ is an anion of arylsulfonic acid, an anion of perfluoroalkyl sulfonic acid, an anion of perhalogenated Lewis acid, an anion of perfluoroalkyl sulfonimide, an anion of perhalogenated acid, or an anion of alkyl or aryl borate.

6. The electrically conductive composition according to claim 1, wherein (A) the carbon nanotube is uniformly dispersed in the composition.

7. The electrically conductive composition according to claim 1, further comprising a solvent.

8. The electrically conductive composition according to claim 1, which is used for thermoelectric conversion.

9. An electrically conductive film, formed using the electrically conductive composition according to claim 1.

10. An electrically conductive film, formed by shaping the electrically conductive composition according to claim 1, and then providing the shaped product with heat or active energy rays.

11. An electrically conductive laminate, comprising a substrate, and the electrically conductive film according to claim 9 on the substrate.

12. An electrically conductive laminate, formed by coating the electrically conductive composition according to claim 1 onto a substrate.

13. An electrically conductive laminate, formed by coating the electrically conductive composition according to claim 1 onto a substrate, and then providing the coated product with heat or active energy rays.

14. The electrically conductive laminate according to claim 11, wherein the substrate is a resin film.

15. The electrically conductive laminate according to claim 11, further having an electrode.

16. A thermoelectric conversion element, comprising an electrically conductive film formed using the electrically conductive composition according to claim 1, or an electrically conductive laminate comprising a substrate, and the electrically conductive film formed using the electrically conductive composition according to claim 1 on the substrate.

17. An electrically conductive article, using any one of the electrically conductive composition according to claim 1 an electrically conductive film formed using the electrically conductive composition according to claim 1, and an electrically conductive laminate comprising a substrate and the electrically conductive film formed using the electrically conductive composition according to claim 1 on the substrate.

18. A thermoelectric generator, using the thermoelectric conversion element according to claim 16.

19. A method of producing an electrically conductive film, comprising a step of shaping the electrically conductive composition according to claim 1.

20. The method of producing an electrically conductive film according to claim 19, wherein the shaping step is a step of coating the electrically conductive composition onto a substrate.

21. The method of producing an electrically conductive film according to claim 19, further comprising a step of heating the shaped product or irradiating the shaped product with active energy rays.

* * * * *